(12) United States Patent
Nayaknur

(10) Patent No.: US 12,231,052 B2
(45) Date of Patent: Feb. 18, 2025

(54) ENABLE CIRCUIT WITH WINDING SIGNAL DETECTION

(71) Applicant: POWER INTEGRATIONS, INC., San Jose, CA (US)

(72) Inventor: Akshay Nayaknur, Sunnyvale, CA (US)

(73) Assignee: POWER INTEGRATIONS, INC., San Jose, CA (US)

( * ) Notice: Subject to any disclaimer, the term of this patent is extended or adjusted under 35 U.S.C. 154(b) by 165 days.

(21) Appl. No.: 18/084,970

(22) Filed: Dec. 20, 2022

(65) Prior Publication Data

US 2024/0204678 A1 Jun. 20, 2024

(51) Int. Cl.
  *H02M 3/335* (2006.01)
  *G01R 19/165* (2006.01)
  *H02M 1/00* (2007.01)
  *H02M 1/08* (2006.01)

(52) U.S. Cl.
  CPC .. *H02M 3/33592* (2013.01); *G01R 19/16576* (2013.01); *H02M 1/0009* (2021.05); *H02M 1/08* (2013.01); *H02M 1/0003* (2021.05); *H02M 3/33576* (2013.01)

(58) Field of Classification Search
  CPC ............. H02M 1/0003; H02M 1/0006; H02M 1/0009; H02M 1/0025; H02M 1/0032; H02M 1/0041; H02M 1/0054; H02M 1/08; H02M 1/32; H02M 3/335; H02M 3/33507; H02M 3/33515; H02M 3/33569;

(Continued)

(56) References Cited

U.S. PATENT DOCUMENTS

| 8,077,486 B2 | 12/2011 | Djenguerian et al. |
| 8,467,157 B2 | 6/2013 | Gaknoki et al. |
| 8,929,107 B2 | 1/2015 | Kang et al. |

(Continued)

FOREIGN PATENT DOCUMENTS

WO 2018097820 A1 5/2018

OTHER PUBLICATIONS

European Application No. 23217498.7; "Communication pursuant to Rules 70(2) and 70a(2) EPC and reference to Rule 39(1) EPC"; mailed Jul. 8, 2024; 2 pages.

(Continued)

*Primary Examiner* — Thienvu V Tran
*Assistant Examiner* — Shahzeb K Ahmad

(57) ABSTRACT

A controller for use in a power converter comprising a control circuit coupled to generate a secondary drive signal to control a secondary switch. An enable circuit coupled to generate an enable signal to enable or disable the control circuit from generating the secondary drive signal. The enable circuit further comprising a winding signal detection circuit coupled to receive a discontinuous conduction mode (DCM) signal representative of a determination that the secondary switch has stopped conducting and a winding signal representative of a voltage of an output winding. The winding signal detection circuit is coupled to determine if the winding signal is less than a threshold at least an N number of times. The enable circuit is coupled to disable the control circuit from generation of the secondary drive signal to turn ON the secondary switch in response to the winding signal detection circuit.

19 Claims, 10 Drawing Sheets

(58) Field of Classification Search
CPC .......... H02M 3/33576; H02M 3/33592; G01R 19/16576; Y02B 70/10
See application file for complete search history.

(56) References Cited

U.S. PATENT DOCUMENTS

| | | | |
|---|---|---|---|
| 9,136,765 B2 | 9/2015 | Balakrishnan et al. | |
| 9,312,777 B2 | 4/2016 | Lefedjiev et al. | |
| 9,374,011 B2 | 6/2016 | Liu et al. | |
| 9,444,357 B1 | 9/2016 | Matthews et al. | |
| 9,680,383 B2 | 6/2017 | Mao et al. | |
| 9,742,288 B2 | 8/2017 | Balakrishnan et al. | |
| 9,780,666 B2 | 10/2017 | Odell et al. | |
| 10,171,071 B2 | 1/2019 | Ratz | |
| 10,186,976 B2 | 1/2019 | Duvnjak | |
| 10,298,110 B2 | 5/2019 | Pham et al. | |
| 10,389,108 B2 | 8/2019 | Duvnjak | |
| 10,554,134 B2 | 2/2020 | Werner et al. | |
| 10,554,136 B1 * | 2/2020 | Miletic | H02M 3/33515 |
| 10,826,398 B2 | 11/2020 | Wang et al. | |
| 11,283,343 B2 | 3/2022 | Deng et al. | |
| 11,368,148 B2 | 6/2022 | Thalheim | |
| 11,588,411 B1 | 2/2023 | Nayaknur | |
| 2012/0068761 A1 | 3/2012 | Banerjee | |
| 2015/0318790 A1 | 11/2015 | Tichy et al. | |
| 2015/0326008 A1 * | 11/2015 | Bäurle | H02H 3/087 361/87 |
| 2017/0317598 A1 | 11/2017 | Ptacek et al. | |
| 2018/0212527 A1 * | 7/2018 | Kong | H02M 3/33592 |
| 2018/0358902 A1 * | 12/2018 | Duvnjak | H02M 3/33592 |
| 2021/0175810 A1 * | 6/2021 | Odell | H02M 3/33507 |
| 2021/0184556 A1 * | 6/2021 | Deng | H02M 1/0058 |
| 2022/0200466 A1 | 6/2022 | Guo et al. | |
| 2022/0209676 A1 * | 6/2022 | Li | H02M 3/01 |
| 2023/0188046 A1 * | 6/2023 | Chen | H02M 1/08 363/89 |

OTHER PUBLICATIONS

European Application No. 23217498.7; "Extended European Search Report"; mailed Jun. 4, 2024; 9 pages.

* cited by examiner

ENABLE CIRCUIT WITH WINDING SIGNAL DETECTION

BACKGROUND OF THE INVENTION

Field of the Invention

The present disclosure relates generally to power converters, and more particularly, to controllers for power converters.

Discussion of the Related Art

Electronic devices use power to operate. Switched mode power converters are commonly used due to their high efficiency, small size and low weight to power many of today's electronics. Conventional wall sockets provide a high voltage alternating current. In a switching power converter, a high voltage alternating current (ac) input is converted to provide a well-regulated direct current (dc) output through an energy transfer element. The switched mode power converter controller usually provides output regulation by sensing one or more signals representative of one or more output quantities and controlling the output in a closed loop. In operation, a switch is utilized to provide the desired output by varying the duty cycle (typically the ratio of the on time of the switch to the total switching period), varying the switching frequency, or varying the number of pulses per unit time of the switch in a switched mode power converter.

Power converters generally include one or more controllers which sense and regulate the output of the power converter. A controller coupled to the output-side of the power converter is generally referred to as a secondary controller or secondary control circuit while a controller coupled to the input-side of the power converter is generally referred to as a primary controller or primary control circuit. The primary controller controls the turn ON and turn OFF of a switch, generally referred to as a power switch, to transfer energy between the input and the output of the power converter. The secondary controller may sense the output of the power converter and determine if the power switch should be turned ON. A request can be sent by the secondary controller to the primary controller to turn ON the power switch.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
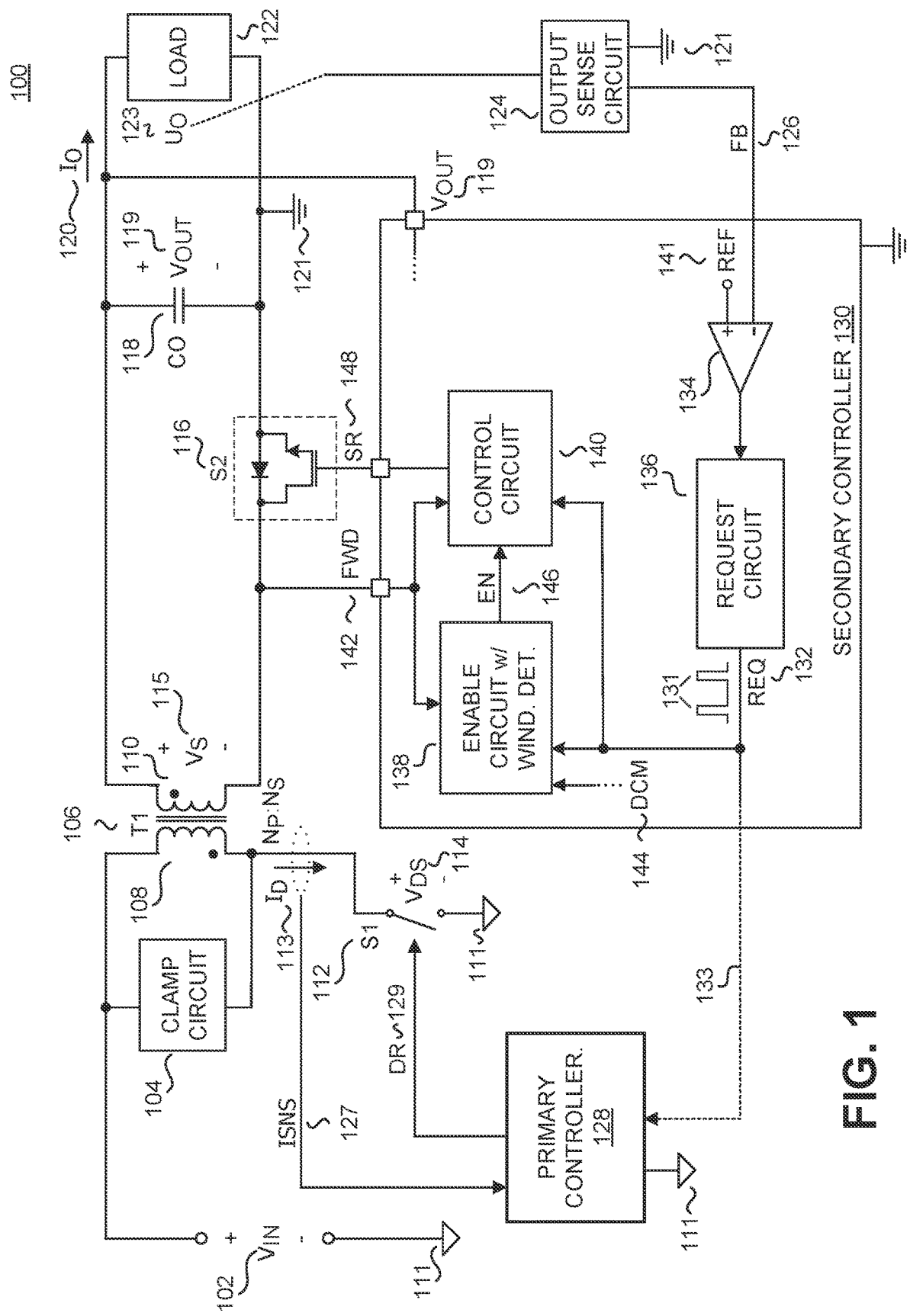
FIG. 1 illustrates an example power converter with a controller including an enable circuit with winding signal detection in accordance with embodiments of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

Isolated power converters generally have an input-side (also referred to as a primary-side) and an output-side (also referred to as a secondary-side) which are galvanically isolated from each other. Circuits coupled to the input-side of the power converter are referenced to an input return while circuits coupled to the output-side of the power converter are referenced to an output return. The input return and output return are also galvanically isolated. Since the input-side is galvanically isolated from the output-side, there is no direct (dc) current path across the isolation barrier of the power converter. Power converters may utilize energy transfer elements, with input windings and output windings, such as a transformer or coupled inductor to maintain the isolation.

As mentioned above, a power converter generally includes one or more controllers or control circuits which sense and regulate the output of the power converter. An output-side coupled controller is generally referred to as a secondary controller or secondary control circuit while an input-side coupled controller is generally referred to as a primary controller or primary control circuit. The primary controller controls the turn ON (e.g. closed switch) and turn OFF (e.g. open switch) of a power switch on the input-side to control the transfer of energy between the input-side and the output-side of the power converter. The secondary controller may sense the output of the power converter and determine if the power switch should be turned ON. A request can be sent by the secondary controller to the primary controller to turn ON the power switch.

Some power converters, such as a synchronous power converter, may also include a switch on the output-side of the power converter, such as a switch of a synchronous rectification circuit used as an output rectifier. This output-side switch may be referred to as a secondary switch. The secondary switch may be used to increase the efficiency with which the energy is transferred to the output-side of the power converter when the power switch is controlled in the OFF state. In operation, the secondary switch may be switched between the ON state and the OFF state in coordination with the power switch such that both switches are not conducting simultaneously to prevent a condition where the power converter attempts to provide energy to a short circuit at the output which may lead to a reduction in the efficiency of the power converter. The condition in which both the power switch and the secondary switch are ON may be referred to as cross-conduction.

Power converters may include an energy transfer element with one or more input-side windings (also referred to as primary side windings) and one or more output-side windings (also referred to as secondary side windings). The voltage across the output-side winding is related to the voltage across the input-side winding and the turns ratio of the energy transfer element when the power switch is conducting. As such, the voltage across the output-side winding could be used to sense when the power switch is not-conducting and control the turn ON and turn OFF of the secondary switch. For example, if a winding signal representative of the voltage ($V_S$) across the output-side winding falls below an on threshold, the secondary switch is controlled ON. If the winding signal rises above an off threshold, the secondary switch is controlled OFF.

The power switch is generally controlled ON in response to a request from the secondary controller. The secondary controller may sense the turn OFF of the power switch from the winding signal and controls the turn ON and turn OFF of the secondary switch in response to the winding signal.

Electrical fast transients (EFTs) may inadvertently turn ON the power switch without the receipt of a request from the secondary controller. The inadvertent turn ON may result in ringing in the voltage across the output-side winding. Under certain conditions, the ringing may fall below the on threshold of the secondary switch and inadvertently turns ON the secondary switch. Further, the inadvertent turn ON of the secondary switch could occur at the same time that the primary controller receives a request and controls the turn ON off the power switch. As such, the power switch and the secondary switch may fall out of coordination and there may be an increased likelihood of cross-conduction.

Embodiments of the present disclosure include a secondary controller with an enable circuit and a secondary control circuit. The secondary control circuit is coupled to control the turn ON and turn OFF of the secondary switch. The enable circuit is coupled to enable or disable the secondary control circuit from controlling the turn ON of the secondary switch.

In embodiments, the enable circuit includes a winding signal detection circuit. The winding signal detection circuit is coupled to sense the number of times which the winding signal has fallen below a threshold TH. In other words, the winding signal detection circuit determines the number of times which the winding signal has fallen below the threshold TH prior to the transmittal of a request to turn ON the power switch. In one example, the threshold TH is representative of the output return of the power converter. In embodiments, the output return is the voltage reference for output-side coupled circuits of the power converter. The switching cycle refers to the sum of the on-time $T_{ON}$ and the off-time $T_{OFF}$ of the power switch. In one embodiment, if the winding signal detection circuit senses at least N number of times which the winding signal has fallen below the threshold TH during a switching cycle, the enable circuit disables the control circuit from turning ON the secondary switch in the next switching cycle. In another embodiment, the enable circuit disables the control circuit from turning ON the secondary switch after the next request to turn ON the power switch if the winding signal detection circuit senses at least N number of times which the winding signal has fallen below the threshold TH. In one example, the turn-on threshold for the secondary switch may be used as the threshold TH for winding signal detection. Further, the secondary controller includes a discontinuous conduction mode (DCM) sense circuit. The DCM sense circuit determines when the power converter is operating in DCM. The winding signal detection circuit determines the number of times which the winding signal has fallen below the threshold TH when the secondary controller determines the power converter is operating in DCM.

FIG. 1 illustrates an example power converter 100 with a secondary controller 130 including an enable circuit 138 with winding signal detection in accordance with embodiments of the present disclosure. The illustrated power converter 100 further includes a clamp circuit 104, energy transfer element T1 106, an input winding 108 of the energy transfer element T1 106, an output winding 110 of the energy transfer element T1 106, a power switch S1 112, an input return 111, an output rectifier S2 116, an output capacitor CO 118, an output return 121, an output sense circuit 124, a primary controller 128, and a secondary controller 130. A communication link 133 between the secondary controller 130 and the primary controller 128 is also illustrated. The secondary controller 130 is further show as including a comparator 134, a request circuit 136, an enable circuit 138, and a control circuit 140.

Further shown in FIG. 1 are an input voltage $V_{IN}$ 102, a switch current $I_D$ 113, a switch voltage $V_{DS}$ 114, a secondary winding voltage $V_S$ 115, an output voltage $V_{OUT}$ 119, an output current $I_O$ 120, an output quantity $U_O$ 123, a feedback signal FB 126, a request signal REQ 132, a reference REF 141, a winding signal FWD 142, a DCM signal 144, an enable signal EN 146, a secondary drive signal SR 148, a current sense signal ISNS 127 and a primary drive signal DR 129.

In the illustrated example, the power converter 100 is shown as having a flyback topology. Further, the input of power converter 100 is galvanically isolated from the output of the power converter 100, such that input return 111 is galvanically isolated from output return 121. Since the input and output of power converter 100 are galvanically isolated, there is no direct current (dc) path across the isolation barrier of energy transfer element T1 106, or between input winding 108 and output winding 110, or between input return 111 and output return 121. It is appreciated that other known topologies and configurations of power converters may also benefit from the teachings of the present disclosure.

The power converter 100 provides output power to a load 122 from an unregulated input voltage $V_{IN}$ 102. In one embodiment, the input voltage $V_{IN}$ 102 is a rectified and filtered ac line voltage. In another embodiment, the input voltage $V_{IN}$ 102 is a dc input voltage. The input voltage $V_{IN}$ 102 is coupled to the energy transfer element 106. In some examples, the energy transfer element 106 may be a coupled inductor, transformer, or an inductor. The energy transfer element 106 is shown as including two windings, input winding 108 (also referred to as a primary winding) and output winding 110 (also referred to as a secondary winding). However, the energy transfer element 106 may have more than two windings. The input winding 108 of the energy transfer element is further coupled to the power switch S1 112 and the power switch S1 112 is further coupled to input return 111. Coupled across the input winding 108 is the clamp circuit 104. The clamp circuit 104 limits the maximum voltage on the power switch S1 114.

In one example, the power switch S1 112 may be a transistor such as a metal-oxide-semiconductor field-effect transistor (MOSFET), bipolar junction transistor (BJT), an insulated-gate bipolar transistor (IGBT), a gallium nitride (GaN) based transistor or a silicon carbide (SiC) based transistor. In another example the power switch may be a cascode switch including a normally-on first switch and a normally-off second switch coupled together in a cascode configuration. The first switch may generally be a GaN or SiC based transistor while the second switch may be a MOSFET, BJT, or IGBT.

Output winding 110 is coupled to the output rectifier S2 116, which is exemplified as a transistor used as a synchronous rectifier, also referred to as a secondary switch S2 116. However, the output rectifier may be exemplified as a diode. Output capacitor CO 118 is shown as being coupled to the secondary switch S2 116 and the output return 121. The voltage across the output winding 110 is shown as secondary voltage $V_S$ 115.

The power converter 100 further includes circuitry to regulate the output quantity $U_O$ 123, which in one example may be the output voltage $V_{OUT}$ 119 across the output capacitor CO 118, output current $I_O$ 120, or a combination of the two. The output sense circuit 124 is coupled to sense the output quantity $U_O$ 123 to provide the feedback signal FB 126, representative of the output of the power converter 100, to the secondary controller 130.

The secondary controller 130 is coupled to output the request signal REQ 132 in response to the feedback signal FB 126. In one example, the request signal REQ 132 is representative of a request to turn ON the power switch S1 112. The request signal REQ 132 may include request events 131 which are generated in response to the feedback signal FB 126. In one example, the secondary controller 130 is configured to compare the feedback signal FB 126 with the reference 141. In response to the comparison, the secondary controller 130 may output a request event 131 in the request signal REQ 132. The request signal REQ 132 may be a rectangular waveform with high and low sections. The logic high sections may be referred to as request events 131. In one example, the request event 131 may be a logic high pulse which transitions to a high value and quickly transitions to a low value. In other embodiments it is understood that request signal REQ 132 could be an analog, continually varying signal, while still benefiting from the teachings of the present disclosure.

The secondary controller 130 and the primary controller 128 may communicate via the communication link 133. For the example shown, the secondary controller 130 is coupled to the secondary side (e.g. output-side) of the power converter 100 and is referenced to the output return 121 while the primary controller 128 is coupled to the primary side (e.g. input-side) of the power converter 100 and is referenced to the input return 111. In embodiments, the primary controller 128 and the secondary controller 130 are galvanically isolated from one another and the communication link 133 provides galvanic isolation using an inductive coupling, such as a transformer or a coupled inductor, an optocoupler, capacitive coupling, or other device that maintains the isolation. However, it should be appreciated that in some embodiments, the secondary controller 130 is not galvanically isolated from the primary controller 128. In one example, the communication link 133 may be an inductive coupling formed from a leadframe which supports the primary controller 128 and/or the secondary controller 130.

In one example, the primary controller 128 and secondary controller 130 may be formed as part of an integrated circuit that is manufactured as either a hybrid or monolithic integrated circuit. In one example, primary controller 128 is included in a first integrated circuit die and a secondary controller 130 is included in a second integrated circuit die that are both disposed in the same integrated circuit package. The primary controller 128 and the secondary controller 130 may be considered a control system for the power converter 100 which controls the transfer of energy between an input-side and an output-side of the power converter 100.

The power switch S1 112 may be disposed on a first integrated circuit die that also includes primary controller 128 and the secondary controller 130 is included in a second integrated circuit die. The power switch S1 112, primary controller 128, and secondary controller 130 are disposed in the same integrated circuit package. In another example, the primary controller 128 is included in a first integrated circuit die, the secondary controller 130 is included in a second integrated circuit die, while the power switch S1 112 is included in a third integrated circuit die which are all disposed in the same integrated circuit package. For examples in which the power switch S1 112 is a cascode switch including a first switch and a second switch. Each switch of the cascode power switch S1 112 may be disposed on its own integrated circuit die and included in the same integrated circuit package as the primary controller 128 and secondary controller 130. It should also be appreciated that one of the switches of the cascode power switch may be included in the same integrated circuit die as the primary controller 128. Further, it should be appreciated that both the primary controller 128, the secondary controller 130 and power switch S1 112 need not be included in a single package and may be implemented in separate controller packages or a combination of combined/separate packages.

The primary controller 128 is coupled to receive a current sense signal ISNS 127 representative of the switch current $I_D$ 113 of the power switch S1 112 and the request signal REQ 132 through the communication link 133 and outputs the primary drive signal DR 129. The primary controller 128 provides the primary drive signal DR 129 to the power switch S1 112 to control various switching parameters of the power switch S1 112 to control the transfer of energy from the input to the output of the power converter 100 through the energy transfer element 106. Example of such parameters include switching frequency $f_{SW}$ (or switching period $T_{SW}$), duty cycle, on-time and off-times, or varying the number of pulses per unit time of the power switch S1 112. In addition, the power switch S1 112 may be controlled such that it has a fixed switching frequency or a variable switching frequency.

In one embodiment, the primary controller 128 outputs the primary drive signal DR 129 to control the conduction of the power switch S1 112. It should be appreciated that generally a switch that is ON may conduct current while a switch that is OFF cannot conduct current. In one example, the primary controller 128 outputs the primary drive signal DR 129 to turn ON the power switch S1 112 in response to a request event 131 in the request signal REQ. In another example, the primary controller 128 outputs the primary drive signal DR 129 to turn OFF the power switch S1 112 when the switch current $I_D$ 113 provided by the current sense signal ISNS 127 reaches a current limit. It should be appreciated that other control methods could be used.

The secondary controller 130 is shown as including comparator 134, request circuit 136, enable circuit 138 and control circuit 140. The secondary controller 130 is coupled receive the feedback signal FB 126 and outputs the request signal REQ 132. As mentioned above, the request signal REQ 132 is representative of a request to turn ON the power switch S1 112. The request signal REQ 132 may include request events 131 which are generated in response to the feedback signal FB 126.

Comparator 134 is coupled to receive the feedback signal FB 126 and the reference REF 141. As shown, the reference REF 141 is received at the non-inverting input while the feedback signal FB 126 is received at the inverting input of comparator 134. The reference REF 141 may be representative the value which the output quantity $U_O$ 123 is regulated to. In operation, the comparator 134 is configured to compare the feedback signal FB 126 with the reference REF 141.

Request circuit 136 is coupled to receive the output of comparator 134. In response to the output of comparator 134, the request circuit may output the request signal REQ 132. In particular, the request circuit 136 may output a request event 131 in the request signal 132 in response to the comparison between the feedback signal FB 126 and reference REF 141 provided by comparator 134. A request event 131 is representative of a request to turn ON the power switch S1 112.

Enable circuit 138 is coupled to receive the request signal REQ 132, DCM signal 144, and the winding signal FWD 142. The winding signal FWD 142 is representative of the winding voltage $V_S$ 115 across output winding 110. For the example shown in FIG. 1, the winding signal FWD 142 may also be representative of the drain voltage of the transistor of secondary switch S2 116. The DCM signal 144 is representative of the power converter 100 operating in discontinuous conduction mode (DCM). In particular, the DCM signal 144 is representative of a determination by the secondary controller that the power converter 100 is operating in DCM.

The power converter 100 could operate in continuous conduction mode (CCM) or discontinuous conduction mode (DCM). During CCM, there is substantially non-zero current flowing through input winding 108 and output winding 110 at the end of the off-time $T_{OFF}$ of the power switch S1 112 and the power switch S1 112 is turned ON with substantially non-zero current. As such, the switch current $I_D$ 113 is non-zero at the beginning of the on-time $T_{ON}$ of power switch S1 112. During DCM, there is substantially no current flowing through input winding 108 and output winding 110 at the end of the off-time $T_{OFF}$ of the power switch S1 112 and the power switch S1 112 is turned ON with substantially zero current. As such, the switch current $I_D$ 113 is substantially zero at the beginning of the on-time $T_{ON}$ of power switch S1 112. The secondary controller 130 is coupled to receive the output voltage $V_{OUT}$ 119. As will be further discussed, the secondary controller 130 includes a discontinuous conduction mode (DCM) sense circuit and determines if the power converter 100 is operating in DCM in response to the winding signal FWD 142. The DCM sense circuit may also further determine DCM operation in response to the winding signal FWD 142 and output voltage $V_{OUT}$ 119.

In operation, the enable circuit 138 is coupled to output an enable signal EN 146 which enables or disables the control circuit 140 from controlling the secondary switch S2 116 ON. Or in other words, the enable circuit 138 outputs an enable signal EN 146 which enables or disables the control circuit 140 from outputting a secondary drive signal SR 148 to control the secondary switch S2 116 ON. Said another way, the enable circuit 138 may output the enable signal EN 146 from preventing the control circuit 140 from controlling the secondary switch S2 116 ON. In particular, enable circuit 138 may output the enable signal EN 146 from preventing the control circuit 140 from controlling the transistor of the secondary switch S2 116 ON.

The enable circuit 138 determines the number of times which the winding signal FWD 142 falls below threshold TH. In one example, the enable circuit 138 determines the number of times which the winding signal FWD 142 falls below the threshold TH between request events 131 to turn ON the power switch S1 112. For example, the enable circuit 138 determines the number of times which the winding signal FWD 142 falls below the threshold TH after a request event 131 to turn ON the power switch S1 112 and prior to the next received request event 131. In another example, the enable circuit 138 determines the number of times which the winding signal FWD 143 falls below the threshold TH during a switching cycle $T_{SW}$ of power switch S1 112. The switching cycle $T_{SW}$ refers to the sum of the on-time $T_{ON}$ and off-time $T_{OFF}$ of the power switch S1 112. In other words, the switching cycle $T_{SW}$ is one cycle duration of the power switch S1 112 being ON and then being OFF. Further, the enable circuit 138 determines the number of times which the winding signal FWD 142 falls below the threshold TH after the power switch S1 112 has turned OFF, the secondary switch S2 116 has stopped conducting and before the next request event 131 to turn ON the power switch S1 112. In other words, the enable circuit 138 determines the number of times which the winding signal FWD 142 falls below the threshold TH when the power converter 100 is operating in DCM prior to the next request event 131 to turn ON the power switch S1 112. The threshold TH may be representative of the output return 121 of the power converter 100.

If the enable circuit 138 determines that the winding signal FWD 142 has fallen below the threshold TH at least an N number of times after a request event 131 in the request signal REQ 132, the enable circuit 138 outputs the enable signal EN 146 to disable the control circuit 140 from controlling the turn ON the secondary switch S2 116 after the next request event 131. In another example, if the enable circuit 138 determines that the winding signal 142 has fallen below the threshold TH at least an N number of times during a current switching cycle $T_{SW}$, the enable circuit 138 outputs the enable signal EN 146 to disable the control circuit 140 from controlling the turn ON the secondary switch S2 116 for the next switching cycle $T_{SW}$.

Control circuit 140 is coupled to receive the winding signal FWD 142, the request signal REQ, and the enable signal EN 146 and outputs the secondary drive signal SR 148. The control circuit 140 controls the turn ON and turn OFF of secondary switch S2 116. As shown, the secondary switch S2 116 is exemplified as a transistor with an anti-parallel diode. In particular, the control circuit 140 outputs the secondary drive signal SR 148 to control the turn ON and turn OFF of the transistor of the secondary switch S2 116. It should be appreciated that the control circuit 140 may output the secondary drive signal SR 148 to turn OFF the transistor of secondary switch S2 116, however, the anti-parallel diode of secondary switch S2 116 may still conduct. In other words, while the transistor of secondary switch S2 116 is controlled OFF, conduction may still occur across the secondary switch S2 116 through the anti-parallel diode of secondary switch S2 116.

In operation, the control circuit 140 may output the secondary drive signal SR 148 to turn ON the transistor of the secondary switch S2 116 if the received enable signal EN 146 is asserted (e.g. the enable circuit 138 enables the control circuit 140). As will be further shown and discussed, the control circuit 140 compares the winding signal FWD 142 to a turn-on threshold SR_ON and a turn-off threshold SR_OFF. The control circuit 140 outputs the secondary drive signal SR 148 to turn ON the transistor of the secondary switch 116 if the enable signal EN 146 is asserted and the winding signal FWD 142 has reached the turn-on threshold SR_ON after a request event 131 in the request signal REQ 132. In other words, the control circuit 140 outputs the secondary drive signal SR 148 to turn ON the transistor of the secondary switch 116 if the enable signal EN 146 is asserted and the winding signal FWD 142 has fallen below the turn-on threshold SR_ON after a request event 131 in the request signal REQ 132. The control circuit 140 outputs the secondary drive signal SR 148 to turn OFF the transistor of secondary switch 116 if the winding signal FWD 142 has reached the turn-off threshold SR_OFF. Or in other words, control circuit 140 outputs the secondary drive signal SR 148 to turn OFF the secondary switch 116 if the winding signal FWD 142 has risen above the turn-off threshold SR_OFF. In one example, the turn-on threshold SR_ON could also be used as the threshold TH for the winding signal detection of enable circuit 138.

Figure 2A:
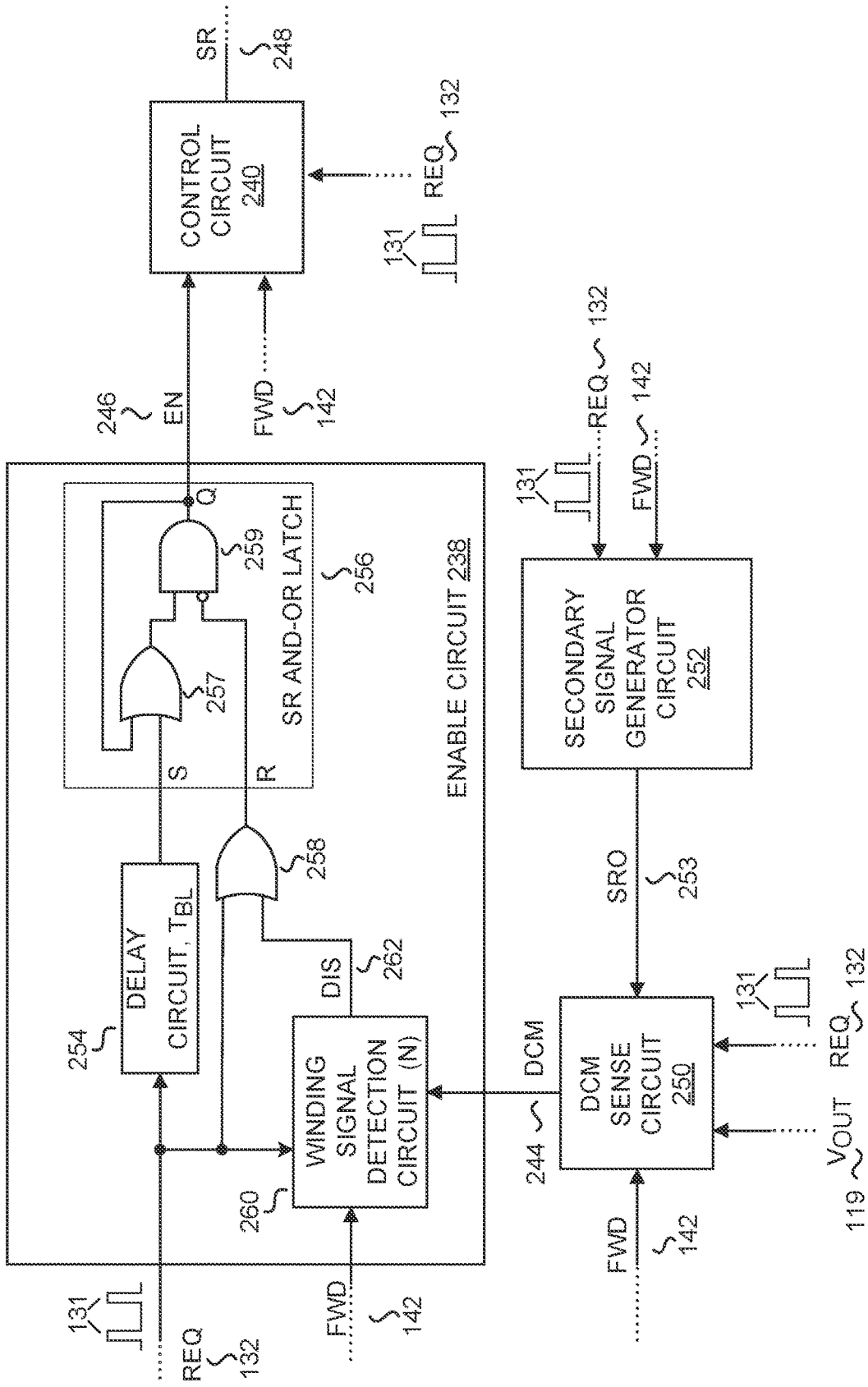
FIG. 2A illustrates one example of a second controller including an enable circuit with winding signal detection of FIG. 1, in accordance with embodiments of the present disclosure.

FIG. 2A illustrates one example of a secondary controller 230 including an enable circuit 238 with winding signal detection circuit 260, in accordance with embodiments of the present disclosure. The secondary controller 230 is one example of secondary controller 130 of FIG. 1, enable circuit 238 is one example of enable circuit 138 of FIG. 1, and control circuit 240 is one example of control circuit 140 of FIG. 1. It should be appreciated that similarly named and numbered elements couple and function as described above. In FIG. 2A, the secondary controller 230 is shown as including an enable circuit 238, control circuit 240, a discontinuous conduction mode (DCM) sense circuit 250, and a secondary signal generator circuit 252. The enable circuit 238 is further shown as include a delay circuit 254, a latch 256, OR gate 258, and winding signal detection circuit 260. The latch 256 is exemplified as an SR AND-OR latch including an OR gate 257 and AND gate 259. FIG. 2A also illustrates the output voltage $V_{OUT}$ 119, winding signal FWD 142, request signal REQ 132, enable signal EN 246, a DCM signal 244, secondary drive signal SR 248, and a secondary signal SRO 253.

Secondary signal generator circuit 252 is coupled to receive the request signal REQ 132 and winding signal FWD 142 and outputs the secondary signal SRO 253. In one example, secondary signal SRO 253 is representative of conduction of the secondary switch S2 116. In particular, secondary signal SRO 253 is representative of conduction of the secondary switch S2 116 if the conduction is due to the transistor of secondary switch 116 being controlled ON or the anti-parallel diode of secondary switch S2 116 conducting. In one example, the secondary signal SRO 253 is a rectangular pulse waveform with varying durations of high and low sections. High sections may represent conduction of the secondary switch S2 116. Or in other words, high sections may represent an enabled and asserted secondary drive signal SR 248.

In operation, secondary signal generator circuit 252 outputs the secondary signal SRO 253 in response to request signal REQ 132 and winding signal FWD 142. In particular, the secondary signal SRO 253 is outputted in response to request events 131 in the request signal REQ 132 and winding signal FWD 142. The secondary signal generator circuit 252 shares similarities with the control circuit 240. At least one difference however, is the secondary signal generator circuit 252 does not receive the enable signal EN 246. As will be further shown and discussed, the secondary signal generator circuit 252 compares the winding signal FWD 142 to a turn-on threshold SR_ON 264 and a turn-off threshold SR_OFF 266. The secondary signal generator circuit 252 asserts the secondary signal SRO 253 if the winding signal FWD 142 has reached the turn-on threshold SR_ON after a request event 131 in the request signal REQ 132. In other words, the secondary signal generator circuit 252 asserts the secondary signal SRO 253 if the winding signal FWD 142 has fallen below the turn-on threshold SR_ON 264 after a request event 131. The secondary signal generator circuit 252 deasserts the secondary signal SRO 253 if the winding signal FWD 142 has reached the turn-off threshold SR_OFF 266. Or in other words, secondary signal generator circuit 252 deasserts the secondary signal SRO 253 if the winding signal FWD 142 has risen above the turn-off threshold SR_OFF 266.

DCM sense circuit 250 is coupled to receive the output voltage $V_{OUT}$ 119, request signal REQ 132, winding signal FWD 142, secondary signal SRO 253, and to output the DCM signal 244. DCM sense circuit 250 determines when the power converter operates in DCM. In one example, the DCM signal 244 is a rectangular pulse waveform with varying durations of high and low sections. A high value for the DCM signal 244 (e.g. asserted) may indicate that the DCM sense circuit 250 has determined that the power converter is operating in DCM. In one example, the DCM sense circuit 250 may assert the DCM signal 244 when the winding signal FWD 142 rises above a DCM threshold DCM_TH after the secondary switch S2 116 has stopped conducting after a request event 131. The DCM sense circuit 250 deasserts the DCM signal 244 at the next request event 131. As such, the DCM signal 244 may be representative of a determination that the secondary switch S2 116 has stopped conducting after a request event 131.

In operation, DCM sense circuit 250 outputs the DCM signal 244 in response to the winding signal FWD 142, output voltage $V_{OUT}$ 119, and request signal REQ 132. In particular, the DCM signal 244 is outputted in response to the winding signal FWD 142, output voltage $V_{OUT}$ 119, and request events 131 in request signal REQ 132. In one embodiment, the DCM sense circuit 250 may assert the DCM signal 244 when the winding signal FWD 142 reaches a DCM threshold DCM_TH. In particular, the DCM sense circuit 250 may assert the DCM signal when the winding signal FWD 142 rises above a DCM threshold DCM_TH after the secondary switch S2 116 has stopped conducting after a request event 131. In one example, the DCM threshold DCM_TH may be the output voltage $V_{OUT}$ 119, the turn-off threshold SR_OFF 266, or another value. For example, the DCM sense circuit 250 determines the beginning of DCM operation when the winding signal FWD 142 reaches the output voltage VOUT 119 after there is no conduction of current by the secondary switch S2 116 after a request event 131. Or in other words, the DCM sense circuit 250 determines the beginning of DCM operation when the winding signal FWD 142 reaches the output voltage VOUT 119 after the secondary signal SRO is deasserted. In another example, the DCM sense circuit 250 may determine the beginning of DCM operation when the winding signal FWD 142 reaches the turn-off threshold SR_OFF 266. The DCM sense circuit 250 determines the end of DCM operation at the next request event 131 in the request signal REQ 132.

Enable circuit 238 is coupled to receive the request signal REQ 132, winding signal FWD 142, DCM signal 244 and output the enable signal EN 246. A delay circuit 254 is coupled to receive the request signal REQ 132 and outputs a delayed request signal 132. For the example shown, the delay circuit 254 applies a delay time $T_{BL}$ 270, also referred to as a blanking time $T_{BL}$ 270, to the request signal 132. For example, if there is a request event 131 in the request signal 132, the delay circuit 254 would output a delayed request signal 132 in which the request event 131 would occur a blanking time $T_{BL}$ 270 after the received request event 131.

OR gate 258 is coupled to receive the request signal REQ 132. The OR gate 258 is also coupled to receive the disable signal DIS 262 output by the winding signal detection circuit 260. As will be further discussed, the disable signal DIS 262 may be a rectangular waveform with varying durations of high or low sections. A high section may correspond with an "asserted" disable signal DIS 262 and representative of detection of at least N number of instances which the winding signal FWD 142 has fallen below a threshold TH. Further, the asserted disable signal DIS 262 may be representative of disabling the control circuit 240. Or in other words, the enable circuit 238 may deassert the enable signal EN 246 in response to an asserted disable signal DIS 262.

Latch 256, shown as an SR AND-OR latch is shown as including an OR gate 257 and AND gate 259. The output of delay circuit 254 is received at the S-input of latch 256 while the output of OR gate 258 is received at the R-input of latch 256. It should be appreciated that the S-input may also be referred to as the set-input while the R-input may also be referred to as the reset-input. As shown, one input of OR gate 257 is the S-input of latch 256. As such, the OR gate 257 is coupled to receive the delayed request signal REQ 132. The other input of OR gate 257 is coupled to receive the output of AND gate 259, which is also the Q-output of latch 256.

AND gate 259 is coupled to receive the output of OR gate 257. Further, an input of AND gate 259 is also the R-input of latch 256. As shown, AND gate 259 is coupled to receive the inverted output of OR gate 258, as shown by the small circle at the input of AND gate 259. The output of latch 256 (e.g. the output of AND gate 259) is the enable signal EN 246. In one example, the enable signal EN 246 is a rectangular waveform of varying durations of high and low sections. A high value for the enable signal EN 246 may correspond to an "asserted" enable signal EN 246 and is representative of enabling the control circuit 240 to allow the turn ON of the secondary switch S2 116. A low value for the enable signal EN 246 may correspond to a "deasserted" enable signal EN 246 and is representative of disabling the control circuit 240 from controlling the turn ON of the secondary switch S2 116.

In operation of latch 256, if the S-input is high while the R-input is low, the Q-output of latch 256 is high (e.g. the latch 256 is set) and the enable signal EN 246 is high. If the R-input is high, regardless of the value on the S-input, the Q-output of latch 256 is low (e.g. the latch 256 is reset) and the enable signal EN 246 is low. If both the S-input and the R-input are low, there is no change to the output of latch 256.

If winding signal detection circuit 260 has not detected that the winding signal FWD 142 has fallen below the threshold TH (e.g., 268 in FIG. 2B) at least an N number of times, the enable signal EN 246 is asserted a blanking time $t_{BL}$ 270 after a received request event 131 in request signal 132 and the control circuit 240 is enabled. The next received request event 131 may reset the latch 256 and the enable signal EN 246 is deasserted. In other words, if the winding signal detection circuit 260 does not detect at least N number of instances which the winding signal FWD has fallen below the threshold TH, the enable signal EN 246 would be high (e.g. asserted) except for a blanking time $T_{BL}$ 270 after every received request event 131.

The winding signal detection circuit 260 is coupled to receive the winding signal FWD 142 and the DCM signal 244 and outputs the disable signal DIS 262. The winding signal detection circuit 260 is also coupled to receive the request signal REQ 132. In operation, winding signal detection circuit 260 determines the number of times which the winding signal FWD 142 falls below the threshold TH 268 between request events 131 in request signal REQ 132. Further, the winding signal detection circuit 260 determines the number of times which the winding signal FWD 142 falls below the threshold TH 268 after the secondary switch S2 116 has stopped conducting after a request event 131 and before the next request event 131 in the request signal REQ 132. In one example, the threshold TH 268 may be representative of the output return 121 of the power converter 100. Winding signal detection circuit 260 determines the number of times which the winding signal FWD 142 falls below the threshold TH 268 when the secondary controller 230 has determined that the power converter 100 is operating in DCM. In one example, the winding signal detection circuit 260 determines the number of relaxation rings of the winding signal FWD 142 which fall below the threshold TH 268 during DCM operation.

In operation, if the winding signal detection circuit 260 determines that the winding signal FWD 142 has fallen below the threshold TH 268 at least N number of times, the winding signal detection circuit 260 asserts the disable signal DIS 262. The disable signal DIS 262 may be a rectangular waveform with varying durations of high or low sections. A high section may correspond with an "asserted" disable signal DIS 262 and representative of detection of at least N number of instances in which the winding signal FWD 142 has fallen below the threshold TH 268. Further, the asserted disable signal DIS 262 is representative of disabling the control circuit 240 from outputting the secondary drive signal SR 248 from turning ON the transistor of secondary switch S2 116. Or in other words, the enable circuit 238 may deassert the enable signal EN 246 in response to an asserted disable signal DIS 262. In some embodiments, if the winding signal detection circuit 260 asserts the disable signal DIS 262, the enable circuit 238 outputs the enable signal EN 246 to disable the control circuit 240 from controlling the turn ON of the transistor of the secondary switch S2 116 after the next request event 131 in the request signal REQ 132.

Control circuit 240 is coupled to receive the winding signal FWD 142, the request signal REQ 132, and the enable signal EN 246 and outputs the secondary drive signal SR 248. The control circuit 240 controls the turn ON and turn OFF of secondary switch S2 116. As shown in FIG. 1, the secondary switch S2 116 is exemplified as a transistor with an anti-parallel diode. Thus, the control circuit 240 may output the secondary drive signal SR 248 to control the turn ON and turn OFF of the transistor of the secondary switch S2 116.

In operation, the control circuit 240 may output the secondary drive signal SR 248 to turn ON the secondary switch S2 116 if the received enable signal EN 246 is asserted (e.g. enables the control circuit 140). As will be further shown and discussed, the control circuit 240 compares the winding signal FWD 142 to a turn-on threshold SR_ON 264 and a turn-off threshold SR_OFF 266. The control circuit 240 can output the secondary drive signal SR 248 to turn ON the secondary switch 116 if the enable signal EN 246 is asserted and the winding signal FWD 142 has reached the turn-on threshold SR_ON 264 after a request event 131 in the request signal REQ 132. In other words, the control circuit 240 outputs the secondary drive signal SR 248 to turn ON the secondary switch 116 if the enable signal EN 246 is asserted and the winding signal FWD 142 has fallen below the turn-on threshold SR_ON 264 after a request event 131 in the request signal REQ 132. In addition, the control circuit 240 may output the secondary drive signal SR 248 to turn ON the secondary switch 116 for a minimum conduction time if the control circuit 240 is enabled. Or in other words, the control circuit 240 may prevent the turn OFF of the secondary switch 116 for at least a minimum conduction time if the control circuit 240 is enabled. In one example, the minimum conduction time of the secondary switch 116 may be substantially 1 microsecond (µs). The control circuit 240 outputs the secondary drive signal SR 248 to turn OFF the secondary switch 116 if the winding signal FWD 142 has reached the turn-off threshold SR_OFF 266. Or in other words, control circuit 240 outputs the secondary drive signal SR 148 to turn OFF the secondary switch 116 if the winding signal FWD 142 has risen above the turn-off threshold SR_OFF. In one example, the turn-on threshold SR_ON 264 could also be used as the threshold TH 268 for the winding signal detection circuit 260.

Figure 2B:
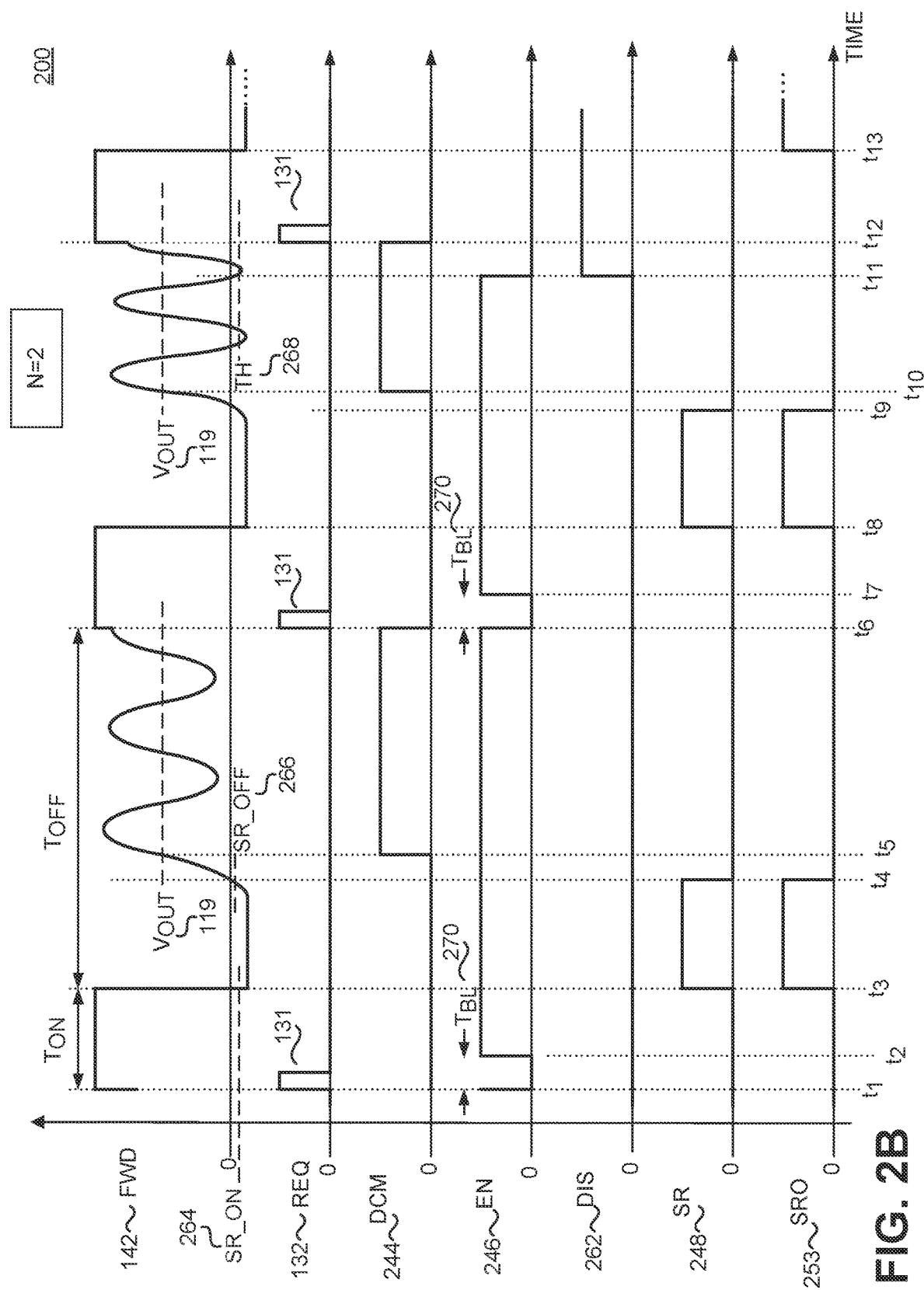
FIG. 2B illustrates a timing diagram of various waveforms of FIGS. 1 and 2A, in accordance with embodiments of the present disclosure.

FIG. 2B illustrates a timing diagram 200 of various waveforms from FIGS. 1 and 2A. In particular, the timing diagram 200 illustrates winding signal FWD 142, request signal REQ 132 with request events 131, DCM signal 244, enable signal EN 246, disable signal DIS 262, secondary drive signal SR 248, and secondary signal SRO 253. It should be further appreciated that certain delays, such as propagation delay, have not been show for clarity.

At time $t_1$, a request event 131 occurs in the request signal 132. As mentioned above, a request event 131 in the request signal 132 is representative of a request to turn on the power switch S1 112. The power switch S1 112 is turned ON and the winding signal FWD 142 increases to a value substantially equal to the product of the input voltage $V_{IN}$ 102 and the turns ratio between the input winding 108 and output winding 110 plus the output voltage $V_{OUT}$ 119, or mathematically: $V_{IN}N_S/N_P+V_{OUT}$. The N P winding signal FWD 142 substantially remains at this value until the power switch S1 112 is turned OFF at time $t_3$. The duration between time $t_1$ and time $t_3$ is substantially the on-time $T_{ON}$ of power switch S1 112. The DCM signal 244, disable signal DIS 262, secondary drive signal SR 248 and secondary signal SRO 253 are substantially low at time $t_1$. While the enable signal EN 246 is shown as transitioning from a high to low value at time $t_1$.

At time $t_2$, the blanking time $T_{BL}$ 270 has elapsed and the enable signal EN 246 transitions to a high value. As such, at time $t_2$ the control circuit 240 is enabled. For the example shown, the control circuit 240 may output the secondary drive signal SR 248 to turn ON the secondary switch S2 116 when the winding signal FWD 142 reaches the turn-on threshold SR_ON 264. The request signal REQ 132, DCM signal 244, disable signal DIS 262, secondary drive signal SR 248 and secondary signal SRO 253 are substantially low at time $t_2$.

At time $t_3$, the power switch S1 112 is turned OFF and the winding signal FWD 142 begins to fall. Enable signal EN 246 is a high value, and the control circuit 240 is enabled. Time $t_3$ indicates the beginning of the off-time of power switch S1 112. Once the winding signal FWD 142 falls below the turn-on threshold SR_ON 264, the secondary drive signal SR 248 transitions to a high value and the secondary switch S2 116 is controlled ON. In particular, the transistor of secondary switch S2 116 is controlled ON. In one example, the turn-on threshold SR_ON 264 is representative of a value in which the control circuit 240 of the secondary controller 230 determines that the primary switch S1 112 has turned OFF and the primary switch S1 112 is not conducting. In one example, the turn-on threshold SR_ON 264 is substantially −100 mV. As shown in FIG. 2B, the secondary drive signal SR 248 transitions to a high value, representative of turning ON of the transistor of secondary switch S2 116. In one example, the secondary drive signal SR 248 is outputted to control the turn ON of the secondary switch S2 116 for a minimum conduction time. Similarly secondary signal SRO 253 transitions to a high value. The request signal REQ 132, DCM signal 244, and disable signal DIS 262 are substantially low at time $t_3$.

At time $t_4$, the winding signal FWD 142 reaches the turn-off threshold SR_OFF 266 and the secondary drive signal SR 248 transitions to a logic low value to control the transistor of secondary switch S2 116 OFF. When the winding signal FWD 142 increases and eventually reaches the turn-off threshold SR_OFF 266, the control circuit 240 determines that current is no longer being conducted by the secondary switch S2 116 and the secondary switch S2 116 may be controlled OFF. Similarly, the secondary signal SRO 253 also transitions to a low value. The request signal REQ 132 and disable signal DIS 262 are substantially low while the enable signal EN 246 is substantially high at time $t_3$.

Once the secondary switch S2 116 is no longer conducting current, the power converter 100 is operating in DCM. For the example shown, the DCM sense circuit 250 determines DCM operation when the winding signal FWD 142 reaches the output voltage $V_{OUT}$ 119 after there is no current conduction by the secondary switch S2 116. Or in other words, the DCM sense circuit 250 determines DCM operation when the winding signal FWD 142 reaches the output voltage $V_{OUT}$ 119 after the secondary signal SRO 253 transitions to a low value. At time $t_5$, the winding signal FWD 142 reaches the output voltage $V_{OUT}$ 119 and the DCM signal 244 transitions to a high value. The request signal REQ 132, disable signal DIS 262, secondary drive signal SR 248 and secondary signal SRO 253 are substantially low while the enable signal EN 246 is substantially high at time $t_5$.

Between times $t_5$ and $t_6$, a relaxation ring due to the secondary parasitic inductances and capacitances is visible in the winding signal FWD 142. Each peak of the relaxation ring on the output winding 110 represents a valley point of the switch voltage $V_{DS}$ 114, and vice versa. The peaks and valleys may be referred to as extremum. As used herein "extremum" or "extrema" includes any local maximum or minimum points or may be referred to as "peaks" and "valleys", where mathematically, the slope (i.e., derivative of the ringing/oscillation waveform) approaches zero.

For the example shown in FIG. 2B, N is substantially equal to two. Between times $t_5$ and $t_6$, the valleys of the relaxation ring are above the output return 121. As such, the winding signal FWD 142 has not fallen below the threshold TH 268 for at least two (N) number of instances and the disable signal DIS 262 remains low. As such, the control circuit 240 remains enabled and may turn ON the secondary switch S2 116 after the next request event 131 at time $t_6$.

At time $t_6$, the next request event 131 occurs. For the example shown, time to is also the end of the off-time $T_{OFF}$ for power switch S1 112 and the beginning of the next switching cycle $T_{SW}$ for power switch S1 112. As shown, the off-time $T_{OFF}$ is the duration between times $t_3$ and $t_6$. In response to the request event 131 at time $t_6$, the DCM signal 244 transitions a low value. The enable signal EN 246 also transitions to a low value. The disable signal DIS 262, secondary drive signal SR 248 and secondary signal SRO 253 are also substantially low at time to. The power switch S1 112 is turned ON and the winding signal FWD 142 increase to a value substantially equal to the product of the input voltage $V_{IN}$ 102 and the turns ratio between the input winding 108 and output winding 110 plus the output voltage $V_{OUT}$ 119, or mathematically: $V_{IN}N_S/N_P+V_{OUT}$. The winding signal FWD 142 substantially remains at this value until the power switch S1 112 is turned OFF at time $t_8$.

At time $t_7$, the blanking time $T_{BL}$ 270 has elapsed and the enable signal EN 246 transitions to a high value and the control circuit 240 is enabled. The request signal REQ 132, DCM signal 244, disable signal DIS 262, secondary drive signal SR 248 and secondary signal SRO 253 are substantially low at time $t_7$.

At time $t_8$, the power switch S1 112 is turned OFF and the winding signal FWD 142 begins to fall. Enable signal EN 246 is a high value, and the control circuit 240 remains enabled. Time $t_8$ also indicates the beginning of the off-time of power switch S1 112. Once the winding signal FWD 142 falls below the turn-on threshold SR_ON 264, the secondary drive signal SR 248 transitions to a high value and the secondary switch S2 116 is controlled ON. In particular, the transistor of secondary switch S2 116 is controlled ON. In one example, the secondary drive signal SR 248 is outputted to control the turn ON of the secondary switch S2 116 for a minimum conduction time. As shown in FIG. 2B, the secondary drive signal SR 248 transitions to a high value, representative of turning ON of the transistor of secondary switch S2 116. Similarly secondary signal SRO 253 transitions to a high value. The request signal REQ 132, DCM signal 244, and disable signal DIS 262 are substantially low at time $t_8$.

At time $t_9$, the winding signal FWD 142 reaches the turn-off threshold SR_OFF 266 and the secondary drive signal SR 248 transitions to a logic low value to control the transistor of secondary switch S2 116 OFF. Similarly, the secondary signal SRO 253 also transitions to a low value. The request signal REQ 132 and disable signal DIS 262 are substantially low while the enable signal EN 246 is substantially high at time $t_9$.

At time $t_{10}$, the winding signal FWD 142 reaches the output voltage $V_{OUT}$ 119 and the DCM signal 244 transitions to a high value indicating DCM operation. The request signal REQ 132, disable signal DIS 262, secondary drive signal SR 248 and secondary signal SRO 253 are substantially low while the enable signal EN 246 is substantially high at time $t_{10}$.

It should be appreciated that N is substantially two for the example of FIGS. 2A and 2B. However, unlike the previous switching cycle $T_{SW}$ of power switch S1 112, the winding signal FWD 142 falls below the threshold TH 268 at least twice. For the example shown, at least two valleys of relaxation ring of the winding signal FWD 142 are below the threshold TH 268 at least twice. At time $t_{11}$, the winding signal FWD 142 falls below the threshold TH 268 for a second time. As such, the disable signal DIS 262 transitions to a high value and the enable signal EN 246 transitions to a low value. The control circuit 240 is disabled from controlling the secondary switch S2 116 ON after the next request event 131 at time $t_{12}$. For the example shown, the control circuit 240 is disabled from controlling the secondary switch S2 116 ON after the next switching cycle $T_{SW}$ of the power switch S1 112. The request signal REQ 132, secondary drive signal SR 248 and secondary signal SRO 253 are substantially low while the DCM signal 244 is substantially high at time $t_{11}$.

At time $t_{12}$, the next request event 131 occurs. For the example shown, time $t_{12}$ is also the start of the next switching cycle $T_{SW}$ for power switch S1 112 begins. In response to the request event 131 at time $t_{12}$, the DCM signal 244 transitions to a low value. The enable signal EN 246 remains at a low value (e.g. deasserted) because the disable signal DIS 262 is high (e.g. asserted). Further, the enable signal EN 246 remains low even after the blanking time TBL 270 elapses due to the asserted disable signal DIS 262. The secondary drive signal SR 248 and secondary signal SRO 253 are also substantially low at time $t_{12}$. The power switch S1 112 is turned ON and the winding signal FWD 142 increases to a value substantially equal to the product of the input voltage $V_{IN}$ 102 and the turns ratio between the input winding 108 and output winding 110 plus the output voltage $V_{OUT}$ 119. The winding signal FWD 142 substantially remains at this value until the power switch S1 112 is turned OFF at time $t_{13}$.

Figure 2C:
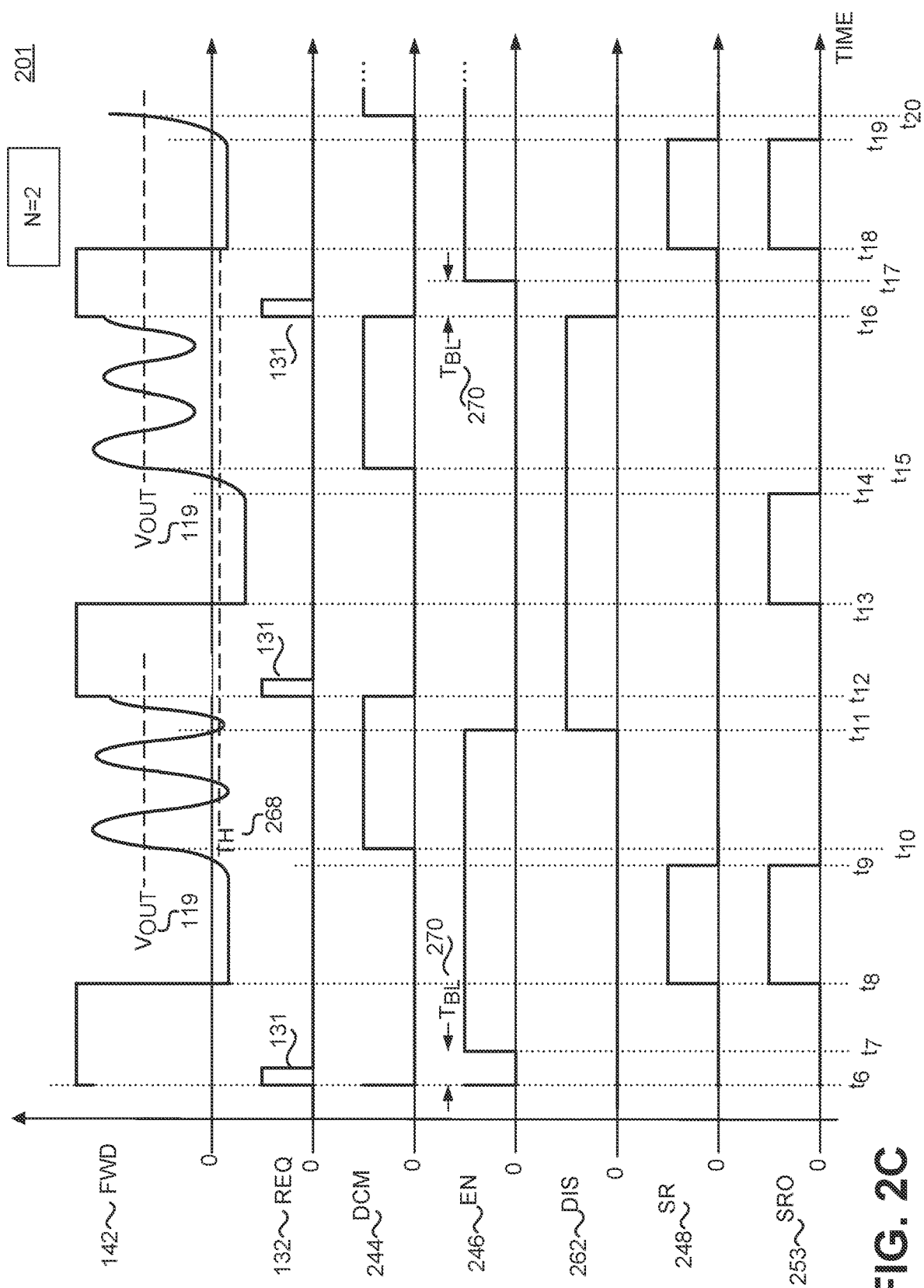
FIG. 2C illustrates another timing diagram of various waveforms of FIGS. 1 and 2A, in accordance with embodiments of the present disclosure.

FIG. 2C illustrates timing diagram 201 illustrating winding signal FWD 142, request signal REQ 132 with request events 131, DCM signal 244, enable signal EN 246, disable signal DIS 262, secondary drive signal SR 248, and secondary signal SRO 253. Timing diagram 201 is a continuation of timing diagram 200 of FIG. 2B, and times to through $t_{13}$ are shown in timing diagram 201 for reference.

At time $t_{13}$, the power switch S1 112 is turned OFF and the winding signal FWD 142 begins to fall. Time $t_{13}$ also indicates the beginning of the off-time $T_{OFF}$ of power switch S1 112. However unlike the previously shown off-time $T_{OFF}$ of power switch S1 112, enable signal EN 246 is a low value while the disable signal DIS 262 is a high value, and the control circuit 240 is disabled from turning ON the secondary switch S2 116. As such, although the winding signal FWD 142 falls below the turn-on threshold SR_ON 264, the secondary drive signal SR 248 does not transition to a high value to turn ON the secondary switch S2 116. In particular, the control circuit 240 is disabled from turning ON the transistor of secondary switch S2 116.

It should be noted that current is conducting through anti-parallel diode of the secondary switch S2 116. As such, the winding signal FWD 142 falls to a value which is representative of the diode drop of the anti-parallel diode of the secondary switch S2 116 between times $t_{13}$ and $t_{14}$. While the secondary drive signal SR 248 does not transition to a high value, the secondary signal generator circuit 252 senses conduction by the secondary switch S2 116 and the secondary signal SRO 253 transitions to a high value. For the example shown, the secondary signal SRO 253 transitions to a high value in response to the winding signal FWD 142 falling below the turn-on threshold SR_ON 264. The request signal REQ 132 and DCM signal 244 are substantially low at time $t_{13}$.

At time $t_{14}$, the winding signal FWD 142 reaches the turn-off threshold SR_OFF 266 indicating that there is no more current conduction in the anti-parallel diode of the secondary switch S2 116. As such, the secondary signal SRO 253 transitions to a low value. The request signal REQ 132 and enable signal EN 246 are substantially low while the disable signal DIS 262 is substantially high at time $t_{14}$.

At time $t_{15}$, the winding signal FWD 142 reaches the output voltage $V_{OUT}$ 119 and the DCM signal 244 transitions to a high value indicating DCM operation. The request signal REQ 132, secondary drive signal SR 248 and secondary signal SRO 253 are substantially low. Further, the enable signal EN 246 is still low while the disable signal DIS 262 is high at time tis.

It should be appreciated that the N number for the winding signal detection circuit 260 is substantially two for FIG. 2C. Between times $t_{15}$ and $t_{16}$, the winding signal FWD 142 does not fall below the threshold TH 268. As such, when the next request event 131 at time $t_{16}$ occurs, the disable signal DIS 262 is deasserted (e.g. transitions to a low value).

At time $t_{16}$, the next request event 131 occurs. For the example shown, time $t_{16}$ is the end of the off-time $T_{OFF}$ for power switch S1 112 and the beginning of the next switching cycle $T_{SW}$ for power switch S1 112. In response to the request event 131 at time $t_{16}$, the DCM signal 244 transitions a low value. The enable signal EN 246 continues to remain at the low value. However, the disable signal DIS 262 transitions to a low value at time $t_{16}$. The secondary drive signal SR 248 and secondary signal SRO 253 are also substantially low at time $t_{16}$. The power switch S1 112 is turned ON and the winding signal FWD 142 increase to a value substantially equal to the product of the input voltage $V_{IN}$ 102 and the turns ratio between the input winding 108 and output winding 110 plus the output voltage $V_{OUT}$ 119.

At time $t_{17}$, the blanking time $T_{BL}$ 270 has elapsed and the enable signal EN 246 transitions to a high value. As such, at time $t_{17}$ the control circuit 240 is enabled and may output the secondary drive signal SR 248 to turn ON the secondary switch S2 116. In particular, the control circuit 240 may output the secondary drive signal SR 248 to turn ON the secondary switch S2 116 when the winding signal FWD 142 reaches the turn-on threshold SR_ON 264. The request signal REQ 132, DCM signal 244, disable signal DIS 262, secondary drive signal SR 248 and secondary signal SRO 253 are substantially low at time $t_{17}$.

At time $t_{18}$, the power switch S1 112 is turned OFF and the winding signal FWD 142 begins to fall. Enable signal EN 246 is a high value, and the control circuit 240 is enabled. Once the winding signal FWD 142 falls below the turn-on threshold SR_ON 264, the secondary drive signal SR 248 transitions to a high value and the secondary switch S2 116 is controlled ON. In one example, the secondary drive signal SR 248 is outputted to control the turn ON of the secondary switch S2 116 for a minimum conduction time. In particular, the transistor of secondary switch S2 116 is controlled ON. Similarly secondary signal SRO 253 transitions to a high value. The request signal REQ 132, DCM signal 244, and disable signal DIS 262 are substantially low at time $t_{19}$.

At time $t_{19}$, the winding signal FWD 142 reaches the turn-off threshold SR_OFF 266 and the secondary drive signal SR 248 transitions to a logic low value to control the transistor of secondary switch S2 116 OFF. Similarly, the secondary signal SRO 253 also transitions to a low value. The request signal REQ 132 and disable signal DIS 262 are substantially low while the enable signal EN 246 is substantially high at time $t_{19}$.

At time $t_{20}$, the winding signal FWD 142 reaches the output voltage $V_{OUT}$ 119 and the DCM signal 244 transitions to a high value indicating DCM operation. The request signal REQ 132, disable signal DIS 262, secondary drive signal SR 248 and secondary signal SRO 253 are substantially low while the enable signal EN 246 is substantially high at time $t_{20}$.

Figure 2D:
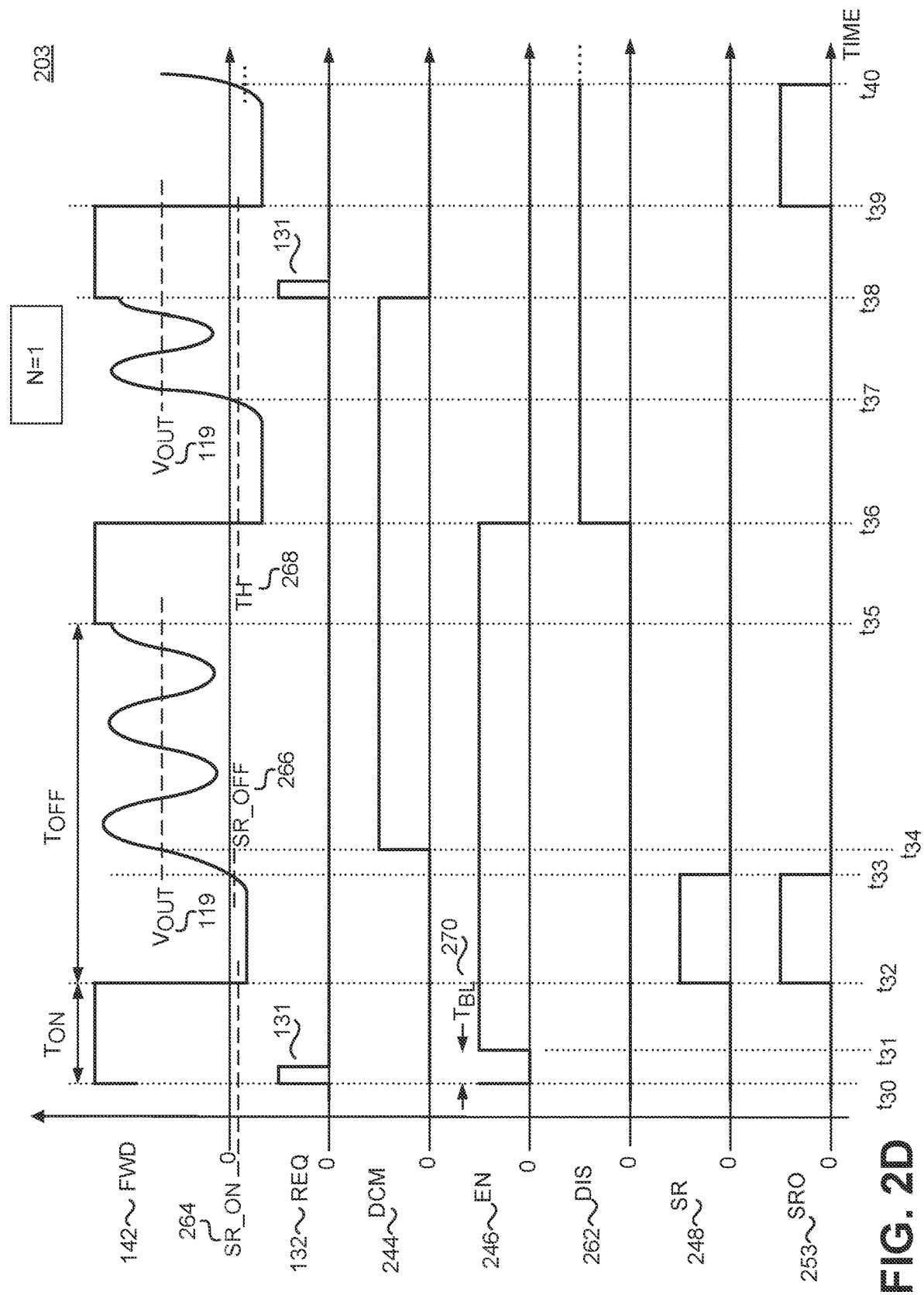
FIG. 2D illustrates a further timing diagram of various waveforms of FIGS. 1 and 2A, in accordance with embodiments of the present disclosure.

FIG. 2D illustrates timing diagram 203 illustrating winding signal FWD 142, request signal REQ 132 with request events 131, DCM signal 244, enable signal EN 246, disable signal DIS 262, secondary drive signal SR 248, and secondary signal SRO 253. Timing diagram 203 illustrates another example in which the winding signal detection circuit 260 determines that the winding signal FWD 142 has fallen below threshold TH 268. For the example shown, the number N is substantially one. Previous waveforms illustrated examples in which the relaxation ring of the winding signal FWD 142 falls below the threshold TH 268. The example of FIG. 2D illustrates an example in which an inadvertent turn ON of the primary switch S1 112 without a request event 131 may be sensed by the winding signal detection circuit 260 and the control circuit 240 may be disabled.

At time $t_{30}$, a request event 131 occurs. The power switch S1 112 is turned ON and the winding signal FWD 142 increase to a value substantially equal to the product of the input voltage $V_{IN}$ 102 and the turns ratio between the input winding 108 and output winding 110 plus the output voltage $V_{OUT}$ 119. The winding signal FWD 142 substantially remains at this value until the power switch S1 112 is turned OFF at time $t_{32}$. The DCM signal 244, disable signal DIS 262, secondary drive signal SR 248 and secondary signal SRO 253 are substantially low at time $t_{30}$.

At time $t_{31}$, the blanking time $T_{BL}$ 270 has elapsed and the enable signal EN 246 transitions to a high value. As such, at time $t_{31}$ the control circuit 240 is enabled and may output the secondary drive signal SR 248 to turn ON the secondary switch S2 116 when the winding signal FWD 142 reaches the turn-on threshold SR_ON 264. The request signal REQ 132, DCM signal 244, disable signal DIS 262, secondary drive signal SR 248 and secondary signal SRO 253 are substantially low at time $t_{31}$.

At time $t_{32}$, the power switch S1 112 is turned OFF and the winding signal FWD 142 begins to fall. Enable signal EN 246 is a high value, and the control circuit 240 is enabled. Once the winding signal FWD 142 falls below the turn-on threshold SR_ON 264, the secondary drive signal SR 248 transitions to a high value and the secondary switch S2 116 is controlled ON. In particular, the transistor of secondary switch S2 116 is controlled ON. As shown in FIG. 2D, the secondary drive signal SR 248 transitions to a high value, representative of turning ON of the transistor of secondary switch S2 116. In one example, the secondary drive signal SR 248 is outputted to control the turn ON of the secondary switch S2 116 for a minimum conduction time. Similarly secondary signal SRO 253 transitions to a high value. The request signal REQ 132, DCM signal 244, and disable signal DIS 262 are substantially low at time $t_{32}$.

At time $t_{33}$, the winding signal FWD 142 reaches the turn-off threshold SR_OFF 266 and the secondary drive signal SR 248 transitions to a logic low value to control the transistor of secondary switch S2 116 OFF. When the winding signal FWD 142 increases and eventually reaches the turn-off threshold SR_OFF 266, the control circuit 240 determines that current is no longer being conducted by the secondary switch S2 116 and the secondary switch S2 116 may be controlled OFF. Similarly, the secondary signal SRO 253 also transitions to a low value. The request signal REQ 132 and disable signal DIS 262 are substantially low while the enable signal EN 246 is substantially high at time $t_{33}$.

Once the secondary switch S2 116 is no longer conducting current, the power converter 100 is operating in DCM. For the example shown, the DCM sense circuit 250 determines DCM operation when the winding signal FWD 142 reaches the output voltage $V_{OUT}$ 119 after there is no current conduction by the secondary switch S2 116. At time $t_{34}$, the winding signal FWD 142 reaches the output voltage $V_{OUT}$ 119 and the DCM signal 244 transitions to a high value. The request signal REQ 132, disable signal DIS 262, secondary drive signal SR 248 and secondary signal SRO 253 are substantially low while the enable signal EN 246 is substantially high at time $t_{34}$.

A relaxation ring due to the secondary parasitic inductances and capacitances is visible in the winding signal FWD 142 after time $t_{33}$. For the example shown, each the relaxation ring in winding signal FWD 142 does not fall below the threshold TH 268. However events may occur which inadvertently turns ON the power switch S1 112. For example, an electrical fast transient (EFT) event may inadvertently turn ON the power switch S1 112.

At time $t_{35}$, an event has occurred which inadvertently turns ON the power switch S1 112 without an occurrence of a request event 131 in the request signal REQ 132. As shown at time $t_{35}$, the winding signal FWD 142 increase to a value substantially equal to the product of the input voltage $V_{IN}$ 102 and the turns ratio between the input winding 108 and output winding 110 plus the output voltage $V_{OUT}$ 119. The winding signal FWD 142 remains at this value until the power switch S1 112 turns OFF at time $t_{36}$.

At time $t_{36}$, the power switch S1 112 is turned OFF and the winding signal FWD 142 begins to fall. As shown, the winding signal FWD 142 falls below the threshold TH 268 while the DCM signal 244 is asserted (e.g. high). For the example of FIG. 2D, the number N is substantially one. As such, at the first instance of the winding signal FWD 142 below the threshold TH 268 while the DCM signal 244 is asserted, the winding signal detection circuit 260 asserts the disable signal DIS 262. As shown, the enable signal EN 246 is deasserted, the disable signal DIS 262 is asserted and the control circuit 240 is not enabled.

However, current is conducting through anti-parallel diode of the secondary switch S2 116. As such, the winding signal FWD 142 falls to a value which is representative of the diode drop of the anti-parallel diode of the secondary switch S2 116 between times $t_{36}$ and $t_{37}$. It should be appreciated that the DCM signal 244 is asserted because the secondary controller 230 determined that the secondary switch S2 116 has stopped conducting current after a request event 131 at time $t_{33}$. However, since the primary switch S1 112 has turned ON without a request event 131, there is or will be current conduction by the anti-parallel diode of the secondary switch S2 116. As such, the power converter is no longer operating in DCM but the controller 240 has determined DCM operation.

At time $t_{38}$, a request event 131 in request signal 132 occurs. The DCM signal 244 is deasserted. The power switch S1 112 is turned ON and the winding signal FWD 142 increases. At time $t_{39}$, the power switch S1 112 is turned OFF and the winding signal FWD 142 decreases. However, the disable signal DIS 262 is asserted and the enable signal EN 246 is deasserted. Although the winding signal FWD 142 falls below the turn-on threshold SR_ON 264, the secondary drive signal SR 248 does not transition to a high value to turn ON the secondary switch S2 116. In particular, the control circuit 240 is disabled from turning ON the transistor of secondary switch S2 116.

Similar to time $t_{36}$, it should be appreciated that current is conducting through anti-parallel diode of the secondary switch S2 116. As such, the winding signal FWD 142 falls to a value which is representative of the diode drop of the anti-parallel diode of the secondary switch S2 116 between times $t_{39}$ and $t_{40}$. While the secondary drive signal SR 248 does not transition to a high value to turn ON the transistor of the secondary switch S2 116, the secondary signal generator circuit 252 senses current conduction by the secondary switch S2 116 and the secondary signal SRO 253 transitions to a high value.

Figure 3A:
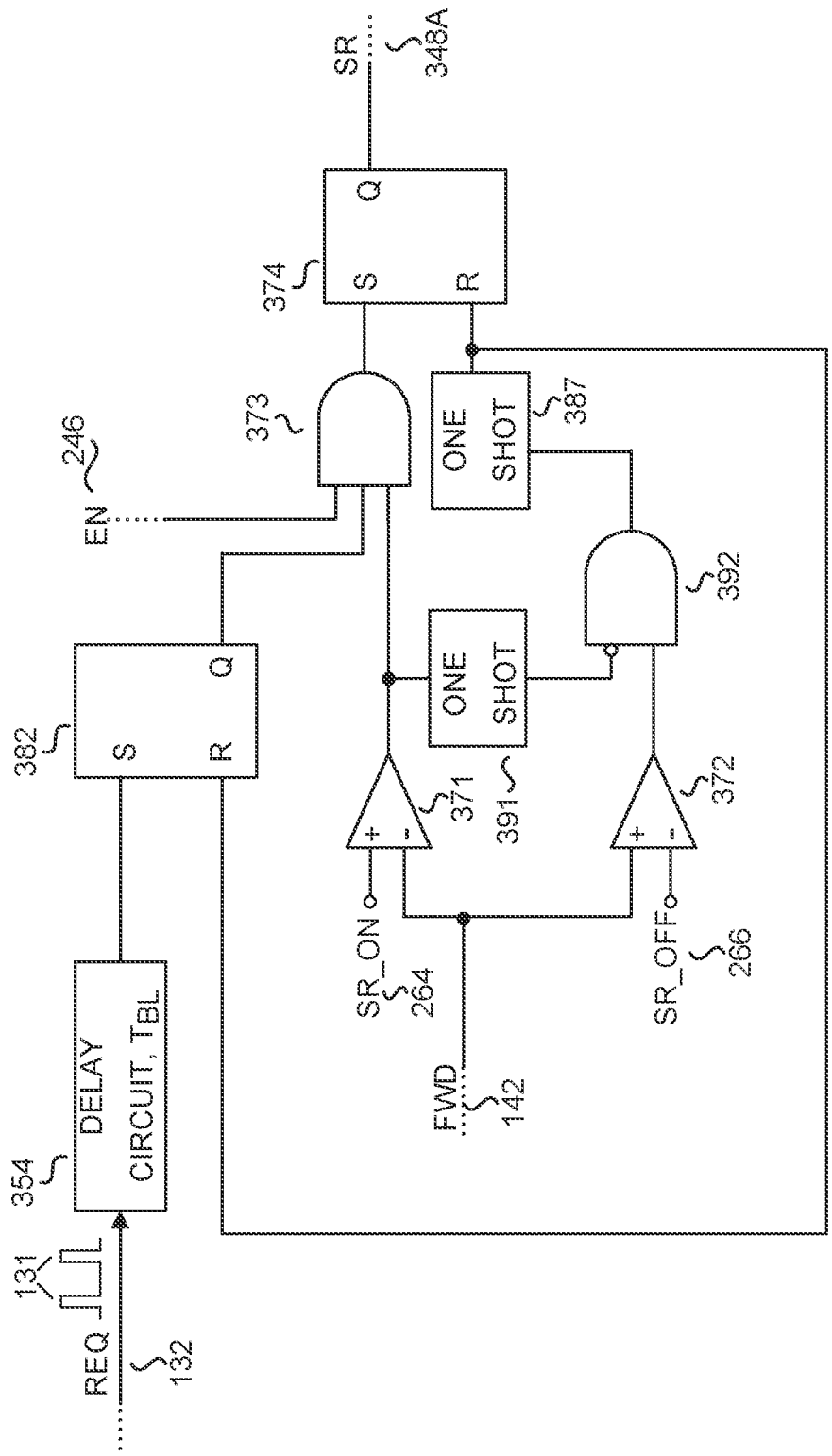
FIG. 3A illustrates an example control circuit for a secondary switch of FIG. 1 or 2A, in accordance with embodiments of the present disclosure.

FIG. 3A illustrates one example of control circuit 340A for controlling the turn ON and turn OFF of the secondary switch S2 116, in accordance with embodiments of the present disclosure. Control circuit 340A is one example of control circuit 240 shown in FIG. 2A and control circuit 140 shown in FIG. 1. It should be appreciated that similarly named and numbered elements couple and function as described above. In FIG. 3A, the control circuit 340A is shown as including a delay circuit 354, comparator 371, comparator 372, AND gate 373, latch 374, latch 382, monostable multivibrator (e.g. one-shot) 387, monostable multivibrator (e.g. one shot) 391, and AND gate 392. FIG. 3A also illustrates the winding signal FWD 142, request signal REQ 132, enable signal EN 246, turn-on threshold SR_ON 264, turn-off threshold SR_OFF 266, and secondary drive signal SR 348A. As mentioned above, the request signal REQ 132 may include request events 131.

Control circuit 340A is coupled to receive the winding signal FWD 142, the request signal REQ 132, and the enable signal EN 246 and outputs the secondary drive signal SR 348A. The control circuit 340A controls the turn ON and turn OFF of secondary switch S2 116. As shown in FIG. 1, the secondary switch S2 116 is exemplified as a transistor with an anti-parallel diode. Thus, the control circuit 340A may output the secondary drive signal SR 348A to control the turn ON and turn OFF of the transistor of the secondary switch S2 116.

Comparator 371 is coupled to receive the winding signal FWD 142 and the turn-on threshold SR_ON 264. In particular, the winding signal FWD 142 is received at the inverting input of comparator 371 while the turn-on threshold SR_ON 264 is received at the non-inverting input of comparator 371. The output of comparator 371 is high if the winding signal FWD 142 is less than the turn-on threshold SR_ON 264 and low if the winding signal FWD 142 is greater than the turn-on threshold SR_ON 264. The output of comparator 371 is received by AND gate 373. In addition, the output of comparator 371 is received by monostable multivibrator 391, also referred to as one-shot circuit 391.

Monostable multivibrator 391 is coupled to the output of comparator 371 and outputs a rectangular waveform with the duration of high sections substantially equal to the minimum conduction time of the secondary switch S2 116. In one example, once the secondary switch S2 116 is turned ON by the control circuit 340A, the secondary switch S2 116 is controlled ON for at least the minimum conduction time. In response to the winding signal FWD 142 falling below the turn-on threshold SR_ON 264, the monostable multivibrator 391 outputs a high duration substantially equal to the minimum conduction time. The output of the monostable multivibrator 391 is received by the AND gate 392. In particular, the AND gate 392 receives the inverted output of monostable multivibrator 391 as shown by the small circle at the input of AND gate 392.

Comparator 372 is coupled to receive the winding signal FWD 142 and the turn-off threshold SR_OFF 266. In particular, the winding signal FWD 142 is received at the non-inverting input of comparator 372 while the turn-off threshold SR_OFF 266 is received at the inverting input of comparator 372. The output of comparator 372 is high if the winding signal FWD 142 is greater than the turn-off threshold SR_OFF 266 and low if the winding signal FWD 142 is less than the turn-off threshold SR_OFF 266. The output of comparator 372 is received by the AND gate 392.

AND gate 392 is coupled to receive the inverted output of the monostable multivibrator 391 and the output of comparator 372. The output of AND gate 392 is received by the monostable multivibrator 387, also referred to as a one-shot circuit 387. In operation, a leading edge in the output of AND gate 392 occurs when the winding signal FWD 142 reaches the turn-off threshold SR_OFF 266 after at least a minimum conduction time has elapsed since the winding signal FWD 142 has fallen below the turn-on threshold SR_ON 264. If the winding signal FWD 142 increases above the turn-off threshold SR_OFF 266 prior to the minimum conduction time elapsing, the leading edge in the output of AND gate 392 occurs substantially with the end of the minimum conduction time. If the winding signal FWD 142 increases above the turn-off threshold SR_OFF 266 after the minimum conduction time has elapsed, the leading edge in the output of AND gate 392 occurs substantially with the winding signal FWD 142 reaching the turn-off threshold SR_OFF 266.

Monostable multivibrator 387 is coupled to receive the output of AND gate 392 and outputs a logic high pulse of a fixed duration in response to a leading edge in the output of AND gate 392. In other words, monostable multivibrator 387 outputs a logic high pulse of a fixed duration in response to the winding signal FWD 142 increasing above the turn-off threshold SR_OFF 266 after at least the minimum conduction time has elapsed. The output of monostable multivibrator 387 is received by latch 374. In particular, the output of monostable multivibrator 387 is received at the R-input (e.g. reset-input) of latch 374. As will be further discussed, the latch 374 is reset and the secondary drive signal SR 348A transitions to a low value to turn OFF the secondary switch S2 116 when the winding signal FWD 142 increases above the turn-off threshold SR_OFF 266. In particular, the latch 374 is reset when the winding signal FWD 142 increases above the turn-off threshold SR_OFF 266 after at least the minimum conduction time has elapsed.

Delay circuit 354 is coupled to receive the request signal REQ 132 and outputs a delayed request signal 132. For the example shown, the delay circuit 354 applies a delay time $T_{BL}$ 270, also referred to as a blanking time $T_{BL}$ 270, to the request signal 132. For example, if there is a request event 131 in the request signal 132, the delay circuit 354 would output a delayed request signal 132 in which the request event 131 would occur a blanking time $T_{BL}$ 270 after the received request event 131. In one example, delay circuit 354 shown in FIG. 3A and FIG. 3B may be the same delay circuit 254 shown in FIG. 2A.

Latch 382 is coupled to receive the output of delay circuit 354 and the output of the monostable multivibrator 387. In particular, the latch 382 is coupled to receive the delayed request signal 132 at its S-input (e.g. set-input) and the output of the monostable multivibrator at its R-input (e.g. reset-input). The Q-output of latch 382 is received by AND gate 373. In operation the latch 382 is set in response to a request event in the delayed request signal REQ 132. In particular, the latch 382 is set after a blanking time TBL 270 has elapsed after a received request event 131 in the request signal REQ 132. In other words, the output of latch 382 is logic high after a blanking time $T_{BL}$ 270 has elapsed after a received request event 131. Latch 382 is reset when the winding signal FWD 142 increases above the turn-off threshold SR_OFF 266.

AND gate 373 is coupled to receive the output of comparator 371, the output of latch 382, and the enable signal EN 246. Latch 374 is coupled to receive the output of AND gate 373. The Q-output of latch 374 is the secondary drive signal SR 348A.

In operation, the AND gate 373 outputs a logic high value and sets the latch 374 when the winding signal FWD 142 falls below the turn-on threshold SR_ON 264 if the enable signal EN 246 is asserted and at least a blanking time $T_{BL}$ 270 has elapsed after a received request event 131. The latch 374 is prevented from being reset until the minimum conduction time of the secondary switch S2 116 has elapsed. If the winding signal FWD 142 reaches the turn-off threshold SR_OFF 266 prior to the minimum conduction time elapsing, the latch 374 is reset substantially when the minimum conduction time has elapsed. If the winding signal FWD 142 reaches the turn-off threshold SR_OFF 266 after the minimum conduction time has elapsed, the latch 374 is reset substantially when the winding signal FWD 142 reaches the turn-off threshold SR_OFF 266. When latch 374 is set, the secondary drive signal SR 348A transitions to a high value to turn ON the secondary switch S2 116. In the example shown, the latch 374 may not be set unless the enable signal EN 246 is asserted. Latch 374 is reset when the winding signal FWD 142 increases above the turn-off threshold SR_OFF 266 after the minimum conduction time has elapsed and the secondary drive signal SR 348A transitions to a low value to turn OFF the secondary switch S2 116. When the winding signal FWD 142 increases above the turn-off threshold SR_OFF 266, latch 382 is reset to prevent the setting of latch 374 and the secondary drive signal SR 348A transitioning to a high value to turn ON the secondary switch S2 116 until the next received request event 131 in request signal REQ 132. While FIGS. 3A and 3B illustrates monostable multivibrator 391 for the minimum conduction time, it should be appreciated that the minimum conduction time may be optional.

Figure 3B:
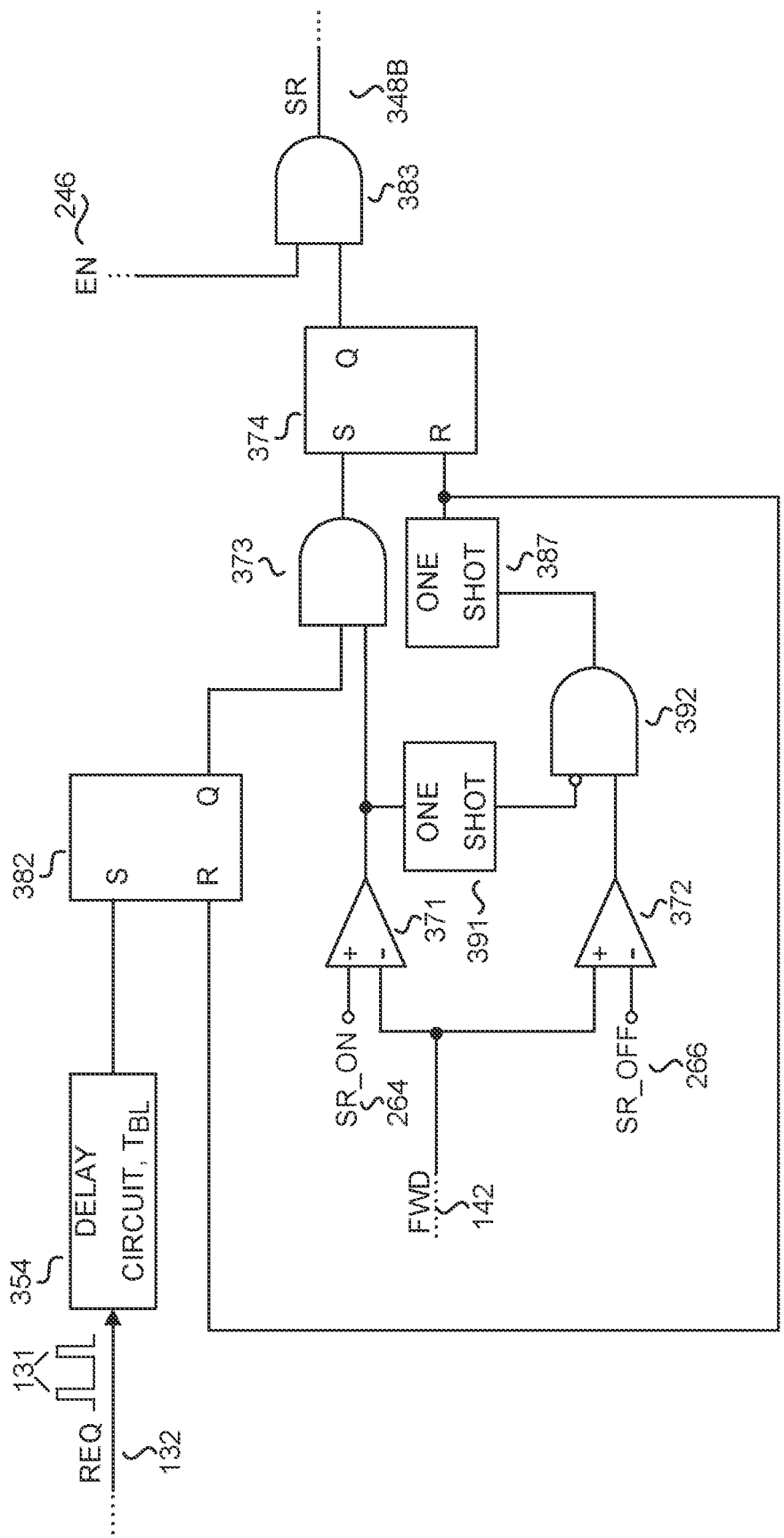
FIG. 3B illustrates another example control circuit for a secondary switch of FIG. 1 or 2A, in accordance with embodiments of the present disclosure.

FIG. 3B illustrates another example of control circuit 340B for controlling the turn ON and turn OFF of the secondary switch S2 116, in accordance with embodiments of the present disclosure. Control circuit 340B is one example of control circuit 240 shown in FIG. 2A and control circuit 140 shown in FIG. 1. It should be appreciated that similarly named and numbered elements couple and function as described above. In FIG. 3B, the control circuit 340B is shown as including a delay circuit 354, comparator 371, comparator 372, AND gate 373, latch 374, latch 382, AND gate 383, and monostable multivibrator (e.g. one-shot) 387. FIG. 3B also illustrates the winding signal FWD 142, request signal REQ 132, enable signal EN 246, turn-on threshold SR_ON 264, turn-off threshold SR_OFF 266, and secondary drive signal SR 348B.

The control circuit 340B of FIG. 3B shares many similarities with the control circuit 340A of FIG. 3A, and similarly named and numbered elements couple and function as described with respect to FIG. 3A. At least one difference however, is the AND gate 373 does not receive the enable signal EN 246 as shown in FIG. 3A. In FIG. 3B, the AND gate 373 is coupled to receive the output of latch 382 and the output of comparator 371. Similarly to FIG. 3A, the output of AND gate 373 is received at the S-input of latch 374. Another difference is the addition of AND gate 383. As shown, AND gate 383 is coupled to receive the output of latch 374 and the enable signal EN 246. The output of AND gate 383 is the secondary drive signal SR 348B.

In operation, the latch 374 is set when the winding signal FWD 142 falls below the turn-on threshold SR_ON 264 if at least a blanking time $T_{BL}$ 270 has elapsed after a received request event 131. The latch 374 is prevented from being reset until the minimum conduction time of the secondary switch S2 116 has elapsed. When latch 374 is set, the secondary drive signal SR 348B transitions to a high value to turn ON the secondary switch S2 116 if the enable signal EN 246 is asserted. Latch 374 is reset when the winding signal FWD 142 increases above the turn-off threshold SR_OFF 266. The secondary drive signal SR 348B transitions to a low value to turn OFF the secondary switch S2 116. In other words, the secondary drive signal SR 348B follows the output of latch 374 if the enable signal EN 246 is asserted. If the enable signal EN 246 is not asserted, the secondary drive signal SR 348B remains low and the secondary switch S2 116 is controlled OFF. In particular, the transistor of secondary switch S2 116 is controlled OFF.

Figure 4:
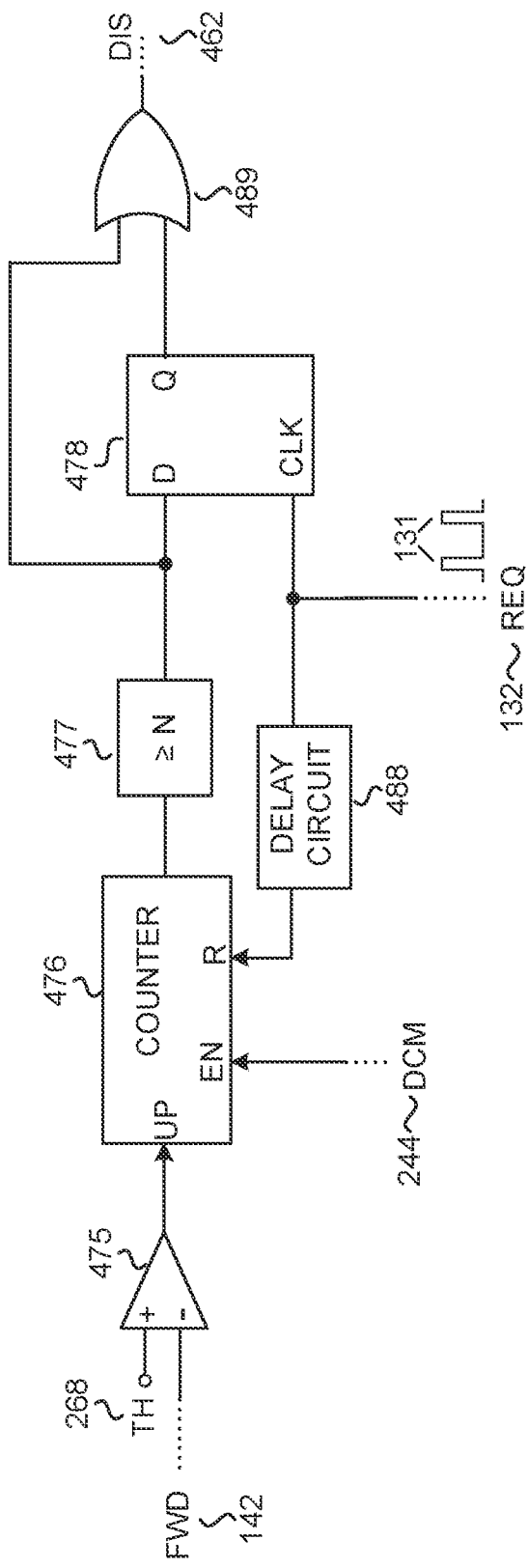
FIG. 4 illustrates an example winding signal detection circuit of FIG. 2A, in accordance with embodiments of the present disclosure.

FIG. 4 illustrates an example winding signal detection circuit 460 for detecting the number of instances which the winding signal FWD 142 falls below a threshold TH 268, in accordance with embodiments of the present disclosure. Winding signal detection circuit 460 is one example of winding signal detection circuit 260 of FIG. 2A. It should be appreciated that similarly named and numbered elements couple and function as described above. In FIG. 4, the winding signal detection circuit 460 is shown as including a comparator 475, counter 476, comparator 477, flip-flop 478, and delay circuit 488. FIG. 4 also illustrates the winding signal FWD 142, request signal REQ 132, DCM signal 244, disable signal DIS 462, and threshold TH 268.

The winding signal detection circuit 460 is coupled to receive the request signal REQ 132, winding signal FWD 142 and the DCM signal 244 and outputs the disable signal DIS 462. The winding signal detection circuit 460 determines the number of times which the winding signal FWD 142 falls below threshold TH between request events 131 in the request signal REQ 132. In particular, the number of times which the winding signal FWD 142 falls below threshold TH during DCM operation between request events 131 in the request signal REQ 132. For example, the winding signal detection circuit 460 determines the number of times which the winding signal FWD 142 falls below the threshold TH 268 after the secondary switch S2 116 has stopped conducting after a request event 131 and before the next request event 131 in the request signal REQ 132. The threshold TH 268 may be representative of the output return 121 of the power converter 100.

Comparator 475 is coupled to receive the threshold TH 268 and the winding signal FWD 142. In particular, the threshold TH 268 is received at the non-inverting input of comparator 475 while the winding signal FWD 142 is received at the inverting input of comparator 475. The output of comparator 475 is logic high if the winding signal FWD 142 is less than the threshold TH 268, and logic low if the winding signal FWD is greater than the threshold TH 268. The output of comparator 475 is received by counter 476.

Counter 476 is coupled to receive the output of comparator 475, the DCM signal 244, and the delayed request signal REQ 132. The counter 476 receives the output of comparator 475 and internal count increments for leading edges in the output of comparator 475. In other words, the counter 476 increments its internal count (e.g. counts up) every time the winding signal FWD 142 falls below threshold TH 268. Further, the counter 476 receives the DCM signal 244 at its enable input and is enabled to increments its internal count when the DCM signal 244 is asserted. As such, the counter 476 increases its internal count for every instance which the winding signal FWD 142 falls below threshold TH 268 during DCM operation between request events 131.

Delay circuit 488 is coupled to receive the request signal REQ 132 and outputs a delayed request signal REQ 132. The delay circuit 488 applies a delay time to the request signal 132. For example, if there is a request event 131 in the request signal 132, the delay circuit 488 would output a delayed request signal 132 in which the request event 131 would occur a delay time after the received request event 131.

Counter 476 is coupled to receive the delayed request signal REQ 132 from delay circuit 488. In operation, the internal count of counter 476 is reset to substantially zero in response to a delayed request event 131 in the request signal REQ 132. Or in other words, when a request event 131 is received, the internal count of counter 476 is reset to substantially zero after a delay time has elapsed. For the example shown, the delay circuit 488 allows the counter 476 to be reset after the flip-flop 478 is clocked by the request event 131 in request signal REQ 132.

The internal count of counter 476 is received by the comparator 477. Comparator 477 could be a digital or analog comparator. As shown, the comparator 477 is coupled to compare the internal count of counter 476 to the number N. If the internal count of counter 476 is equal to or greater than the number N, the output of comparator 477 is high (e.g. asserted) indicating that the winding signal FWD 142 has fallen below the threshold TH 268 at least N number of times since the previous request event 131 while the DCM signal 244 is asserted in request signal REQ 132. The number (e.g. value) N may be provided to the secondary controller 130. For example, the number N may be stored in a register. Values may be stored into a register by trimming external components or receiving signals through communication links such as an inter-integrated circuit (I2C) bus.

Flip-flop 478 is coupled to receive the output of comparator 477 and the request signal REQ 132. In particular, the output of comparator 477 is received at the D-input of flip-flop 478 and the request signal REQ 132 at the clock-input of flip-flop 478. In operation, the Q-output of flip-flop 478 is updated to the value of the output of comparator 477 when a request event 131 occurs in the request signal REQ 132.

The OR gate 489 is coupled to receive the output of comparator 477 and the output of flip-flop 478. If the output of comparator 477 is asserted, indicating that the winding signal FWD 142 has fallen below the threshold TH 268 at least N number of times during DCM operation, the OR gate 489 outputs a logic high value (e.g. asserts) the disable signal DIS 462 to disable the control circuit 240. The OR gate 489 outputs a low value and the disable signal DIS 462 is deasserted if the output of comparator is not asserted, indicating that the winding signal FWD 142 has not fallen below the threshold TH 268 at least N number of times during DCM operation. The output of OR gate 489 would transition to a logic low value when the flop-flop 478 is clocked. Or in other words, the output of OR gate 489 would transition to the low value when a request event 131 in the request signal REQ 132 is received.

If the winding signal FWD 142 has fallen below the threshold TH 268 at least N number of times during DCM operation between request events 131 in request signal REW 132, the disable signal DIS 462 is asserted in response to the output of comparator 477. At the next request event 131 occurring in the request signal REQ 132, the disable signal DIS 462 remains asserted as the output of comparator 477 is asserted at the time the flop-flop 478 is clocked with the receipt of the next request event 131.

The internal count of counter 476 is reset a delay time after the next request event 131. If after the next request event 131, the winding signal FWD 142 continues to fall below the threshold TH 268 at least N number of times during DCM operation, the disable signal DIS 462 remains asserted. If however, after the next request event 131, the winding signal FWD 142 does not fall below the threshold TH 268 at least N number of times during DCM operation, the disable signal DIS 462 is deasserted at occurrence of a subsequent request event 131 in request signal REQ 132.

Figure 5:
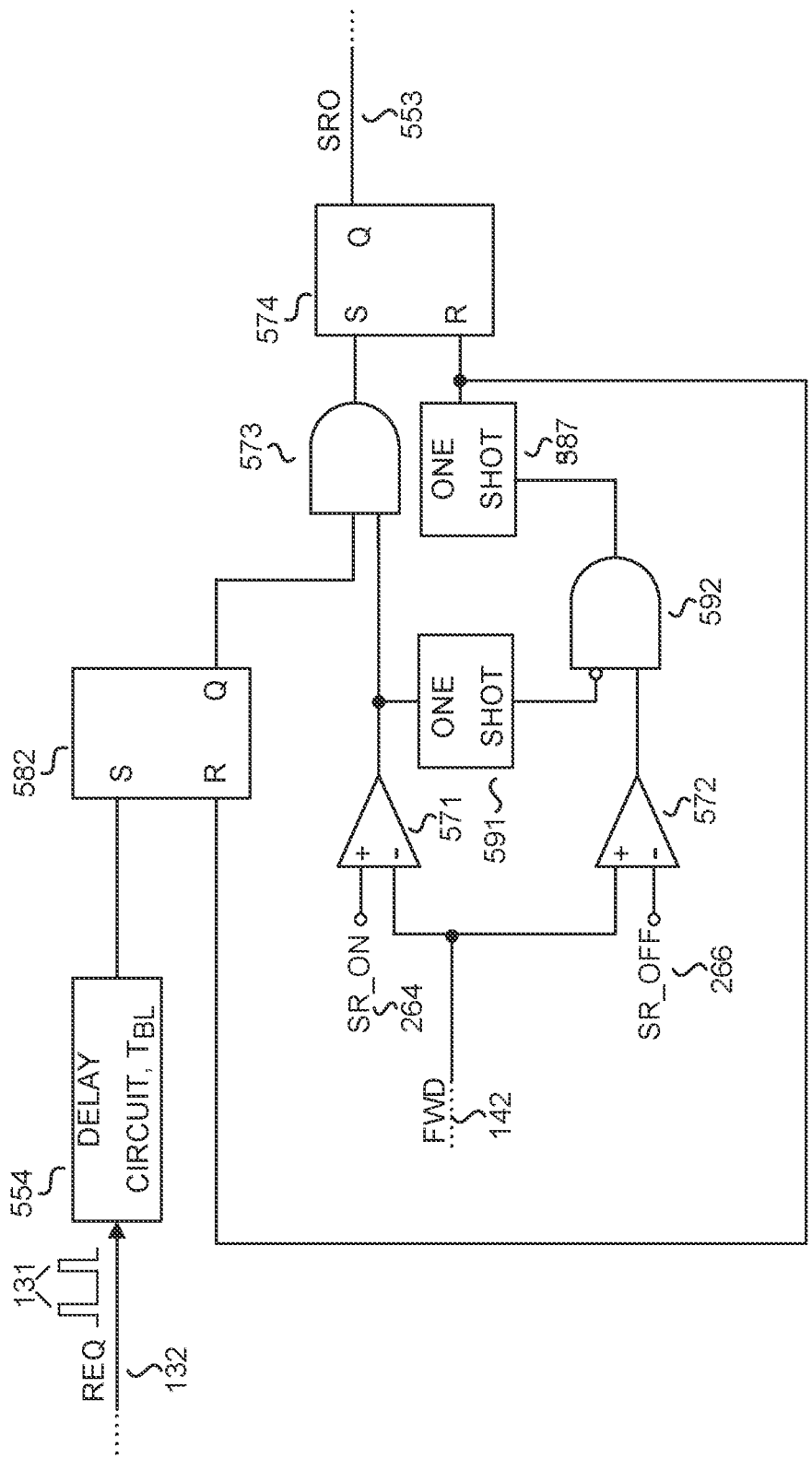
FIG. 5 illustrates an example secondary signal generation circuit of FIG. 2A, in accordance with embodiments of the present disclosure.

FIG. 5 illustrates an example secondary signal generation circuit 552 to output the secondary signal SRO 553, in accordance with embodiments of the present disclosure. Secondary signal generation circuit 552 is one example of secondary signal generation circuit 252 shown in FIG. 2A. In FIG. 5, the secondary signal generation circuit 552 is shown as including a delay circuit 554, comparator 571, comparator 572, AND gate 573, latch 574, latch 582, monostable multivibrator (e.g. one-shot) 587, monostable multivibrator (e.g. one-shot) 591, and AND gate 592. FIG. 5 also illustrates the winding signal FWD 142, request signal REQ 132, turn-on threshold SR_ON 264, turn-off threshold SR_OFF 266, and secondary signal SRO 553. It should be appreciated that the secondary signal generation circuit 552 shares many similarities with control circuits 340A and 340B of FIGS. 3A and 3B, and similarly named and numbered elements couple and function as described above. At least one difference, however, is the secondary signal generation circuit 552 does not receive the enable signal EN 246.

Secondary signal generation circuit 552 is coupled to receive the winding signal FWD 142 and the request signal REQ 132 and outputs the secondary signal SRO 553. In one example, the secondary signal generation circuit 552 determines if the secondary switch S2 116 is conducting current. In another example, the secondary signal SRO 553 is representative of the secondary drive signal SR if the secondary drive signal SR is enabled after every request event 131 in request signal REQ 132. As such, the secondary signal SRO 553 is representative of conduction by the secondary switch S2 116. In particular, the secondary signal SRO 553 is representative of conduction by either the anti-parallel diode or the transistor of secondary switch S2 116.

Comparator 571 is coupled to receive the winding signal FWD 142 and the turn-on threshold SR_ON 264. In particular, the winding signal FWD 142 is received at the inverting input of comparator 571 while the turn-on threshold SR_ON 264 is received at the non-inverting input of comparator 571. The output of comparator 571 is high if the winding signal FWD 142 is less than the turn-on threshold SR_ON 264 and low if the winding signal FWD 142 is greater than the turn-on threshold SR_ON 264. The output of comparator 571 is received by AND gate 573. In addition, the output of comparator 571 is received by monostable multivibrator 591, also referred to as one-shot circuit 591.

Monostable multivibrator 591 is coupled to the output of comparator 571 and outputs rectangular waveform. For example, the output of monostable multivibrator 591 may be a rectangular waveform, with the duration of high sections substantially equal to the minimum conduction time of the secondary switch S2 116. In response to a leading edge in the output of comparator 571, the monostable multivibrator 591 outputs a high duration substantially equal to the minimum conduction time. In other words, in response to the winding signal FWD 142 falling below the turn-on threshold SR_ON 264, the monostable multivibrator 591 outputs a high duration substantially equal to the minimum conduction time. The output of the monostable multivibrator 591 is received by the AND gate 592. In particular, the AND gate 592 receives the inverted output of monostable multivibrator 591 as shown by the small circle at the input of AND gate 592.

Comparator 572 is coupled to receive the winding signal FWD 142 and the turn-off threshold SR_OFF 266. In particular, the winding signal FWD 142 is received at the non-inverting input of comparator 572 while the turn-off threshold SR_OFF 266 is received at the inverting input of comparator 572. The output of comparator 572 is high if the winding signal FWD 142 is greater than the turn-off threshold SR_OFF 266 and low if the winding signal FWD 142 is less than the turn-off threshold SR_OFF 266. The output of comparator 572 is received by AND gate 592.

AND gate 592 is coupled to receive the inverted output of the monostable multivibrator 591 and the output of comparator 572. The output of AND gate 592 is received by the monostable multivibrator 587, also referred to as a one-shot circuit 587. In operation, a leading edge in the output of AND gate 592 occurs when the winding signal FWD 142 reaches the turn-off threshold SR_OFF 266 after at least a minimum conduction time has elapsed since the winding signal FWD 142 has fallen below the turn-on threshold SR_ON 264. If the winding signal FWD 142 increases above the turn-off threshold SR_OFF 266 prior to the minimum conduction time elapsing, the leading edge of the AND gate 592 occurs substantially with the end of the minimum conduction time. If the winding signal FWD 142 increases above the turn-off threshold SR_OFF 266 after the minimum conduction time has elapsed, the leading edge of the AND gate 592 occurs substantially with the winding signal FWD 142 reaching the turn-off threshold SR_OFF 266.

Monostable multivibrator 587 is coupled to receive the output of AND gate 592 and outputs a logic high pulse of a fixed duration in response to a leading edge in the output of AND gate 592. In other words, monostable multivibrator 587 outputs a logic high pulse of a fixed duration in response to the winding signal FWD 142 increasing above the turn-off threshold SR_OFF 266 after at least a minimum conduction time has elapsed since the winding signal FWD 142 has fallen below the turn-on threshold SR_ON 264. The output of monostable multivibrator 587 is received by latch 574. In particular, the output of monostable multivibrator 587 is received at the R-input (e.g. reset-input) of latch 574. As will be further discussed, the latch 574 is reset and the secondary signal SRO 553 transitions to a low value, indicating no current conduction by the secondary switch S2 116, when the winding signal FWD 142 increases above the turn-off threshold SR_OFF 266 after at least a minimum conduction time has elapsed since the winding signal FWD 142 has fallen below the turn-on threshold SR_ON 264.

Delay circuit 554 is coupled to receive the request signal REQ 132 and outputs a delayed request signal 132. For the example shown, the delay circuit 554 applies a delay time $T_{BL}$ 270, also referred to as a blanking time $T_{BL}$ 270, to the request signal 132. For example, if there is a request event 131 in the request signal 132, the delay circuit 554 would output a delayed request signal 132 in which the request event 131 would occur a blanking time $T_{BL}$ 270 after the received request event 131. In one example, delay circuit 554 shown in FIG. 5 may be the same as the delay circuit 354 shown in FIG. 3A and FIG. 3B and delay circuit 254 shown in FIG. 2A.

Latch 582 is coupled to receive the output of delay circuit 554 and the output of the monostable multivibrator 587. In particular, the latch 582 is coupled to receive the delayed request signal 132 at its S-input (e.g. set-input) and the output of the monostable multivibrator at its R-input (e.g. reset-input). The Q-output of latch 582 is received by AND gate 573. In operation the latch 582 is set in response to a request event 131 in the delayed request signal REQ 132. In particular, the latch 582 is set after a blanking time $T_{BL}$ 270 has elapsed after a received request event 131 in the request signal REQ 132. In other words, the output of latch 582 is logic high after a blanking time $T_{BL}$ 270 has elapsed after a received request event 131. Latch 582 is reset when the winding signal FWD 142 increases above the turn-off threshold SR_OFF 266.

AND gate 573 is coupled to receive the output of comparator 571 and the output of latch 582. Latch 574 is coupled to receive the output of AND gate 573. The Q-output of latch 574 is the secondary signal SRO 553.

In operation, the AND gate 573 outputs a logic high value and sets the latch 574 when the winding signal FWD 142 falls below the turn-on threshold SR_ON 264 and at least a blanking time $T_{BL}$ 270 has elapsed after a received request event 131. When latch 574 is set, the secondary signal SRO 553 transitions to a high value (e.g. asserted). The latch 574 is prevented from being reset for at least the minimum conduction time. If the winding signal FWD 142 reaches the turn-off threshold SR_OFF 266 prior to the minimum conduction time elapsing, the latch 574 is reset substantially when the minimum conduction time elapses. If the winding signal FWD 142 reaches the turn-off threshold SR_OFF 266 after the minimum conduction time has elapsed, the latch 574 is reset substantially with the winding signal FWD 142 reaching the turn-off threshold SR_OFF 266. Latch 574 is reset when the winding signal FWD 142 increases above the turn-off threshold SR_OFF 266 and the secondary signal SRO 553 transitions to a low value (e.g. not asserted). When the winding signal FWD 142 increases above the turn-off threshold SR_OFF 266, latch 582 is reset to prevent the setting of latch 574 until the next received request event 131 in request signal REQ 132.

Figure 6:
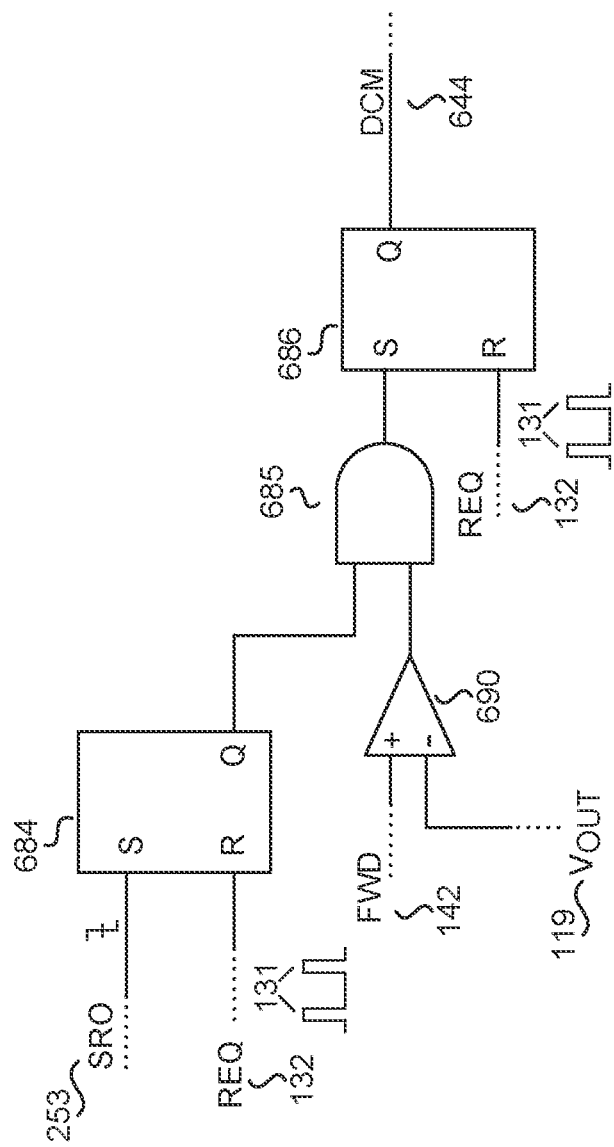
FIG. 6 illustrates an example discontinuous conduction mode (DCM) sense circuit of FIG. 2A, in accordance with embodiments of the present disclosure.

FIG. 6 illustrates an example discontinuous conduction mode (DCM) sense circuit 650 for determining DCM operation of the power converter 100, in accordance with embodiments of the present disclosure. DCM sense circuit 650 is one example of DCM sense circuit 250 shown in FIG. 2A. In FIG. 6, the DCM sense circuit 650 is shown as including a latch 684, an AND gate 685, a latch 686, and a comparator 690. FIG. 6 also illustrates output voltage $V_{OUT}$ 119, request signal REQ 132, winding signal FWD 142, secondary signal SRO 253, and DCM signal 644. It should be appreciated similarly named and numbered elements couple and function as described above.

DCM sense circuit 650 is coupled to receive the output voltage $V_{OUT}$ 119, request signal REQ 132, winding signal FWD 142, secondary signal SRO 253, and outputs the DCM signal 644. In one embodiment, DCM sense circuit 650 determines when the power converter operates in DCM. As mentioned above, the DCM signal 644 is representative of the power converter 100 operating in DCM. The DCM signal 644 is a rectangular pulse waveform with varying durations of high and low sections. A high value for the DCM signal 644 may indicate that the DCM sense circuit 650 has determined that the power converter 100 is operating in DCM. In one example, the DCM sense circuit 650 may assert the DCM signal 644 when the winding signal FWD 142 rises above a DCM threshold DCM_TH after the secondary switch S2 116 has stopped conducting after a request event 131. The DCM sense circuit 650 deasserts the DCM signal 644 at the next request event 131. In one example, the DCM threshold DCM_TH may be the output voltage $V_{OUT}$ 119, the turn-off threshold SR_OFF 266, or another value.

Latch 684 is coupled to receive the secondary signal SRO 253 and the request signal REQ 132. In particular, the secondary signal SRO 253 is received at the S-input (set-input) of latch 684 while the request signal REQ 132 is received at the R-input (reset-input) of latch 684. The Q-output of latch 684 is received by the AND gate 685. The latch 684 is set (e.g. outputs a high value) in response to a falling edge in the secondary signal SRO 253. Or in other words, the latch 684 is set when the secondary signal SRO 253 indicates that there is no conduction by the secondary switch S2 116. Said another way, the latch 684 is set when the winding signal FWD 142 reaches the turn-off threshold SR_OFF 266. Latch 684 is reset (e.g. outputs a low value) in response to a request event 131 in request signal REQ 132.

Comparator 690 is coupled to receive the winding signal FWD 142 and the output voltage $V_{OUT}$ 119. In particular, the winding signal FWD 142 is received at the non-inverting input of comparator 690 while the output voltage $V_{OUT}$ 119 is received at the inverting input of comparator 690. Comparator 690 is high when the winding signal FWD 142 is greater than the output voltage $V_{OUT}$ 119 and is low when the winding signal FWD 142 is less than the output voltage $V_{OUT}$ 119. The output of comparator 690 is received by AND gate 685. It should be appreciated that the comparator 690 receives the DCM threshold DCM_TH and compares the winding signal FWD 142 with the DCM threshold DCM_TH. In the example shown, the DCM threshold DCM_TH is substantially the output voltage $V_{OUT}$ 119. However, the DCM threshold DCM_TH may be the turn-off threshold SR_OFF 266 or another value.

AND gate 685 is coupled to receive the output of latch 684 and the output of comparator 690. The output of AND gate 685 is received by the latch 686. The output of AND gate 685 is high when both the latch 684 is set and the winding signal FWD 142 is greater than the output voltage $V_{OUT}$ 119. In operation, the output of AND gate 685 is high when the winding signal FWD 142 is greater than the output voltage $V_{OUT}$ 119 after a falling edge in the secondary signal SRO 253. In other words, the output of AND gate 685 is high when the winding signal FWD 142 is greater than the output voltage $V_{OUT}$ 119 after the secondary signal SRO 253 determines there is no current conduction by the secondary switch S2 116.

Latch 686 is coupled to receive the output of AND gate 685 and the request signal REQ 132 and outputs the DCM signal 644. As shown, the output of AND gate 685 is received at the S-input (set-input) while the request signal REQ 132 is received at the R-input (reset-input). The Q-output of latch 686 is the DCM signal 644. In operation, the latch 686 is set (e.g. high) when the winding signal FWD 142 is greater than the output voltage $V_{OUT}$ 119 after a falling edge in the secondary signal SRO 253. In other words, the latch 686 is set when the winding signal FWD 142 is greater than the output voltage $V_{OUT}$ 119 after the secondary signal SRO 253 determines there is no current conduction by the secondary switch S2 116. Latch 686 is reset (e.g. low) when a request event 131 occurs in request signal REQ 132. In operation, the DCM sense circuit 650 determines the beginning of DCM operation and asserts the DCM signal 644 when the winding signal FWD 142 reaches the output voltage $V_{OUT}$ 119 after the secondary switch S2 116 stops conducting. Or in other words, the DCM sense circuit 650 determines the beginning of DCM operation and asserts the DCM signal 644 when the winding signal FWD 142 reaches the output voltage $V_{OUT}$ 119 after the secondary signal SRO 253 is deasserted. The DCM sense circuit 650 determines the end of DCM operation and deasserts the DCM signal 644 at the next request event 131 in the request signal REQ 132.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

What is claimed is:

1. A controller for use in a power converter, comprising: a control circuit coupled to generate a secondary drive signal to control a turn ON and a turn OFF of a secondary switch of the power converter; and an enable circuit coupled to generate an enable signal to enable or disable the control circuit from generation of the secondary drive signal to turn ON the secondary switch, the enable circuit comprising: a winding signal detection circuit coupled to receive a discontinuous conduction mode (DCM) signal representative of a determination that the secondary switch has stopped conducting and a winding signal representative of a voltage of an output winding of the power converter, wherein the winding signal detection circuit is coupled to determine if the winding signal is less than a threshold at least an N number of times, wherein N is an integer value, after the determination that the secondary switch has stopped conducting, wherein the enable circuit is coupled to disable the control circuit from generation of the secondary drive signal to turn ON the secondary switch in response to the determination that the winding signal is less than the threshold at least the N number of times by the winding signal detection circuit.

2. The controller of claim 1, wherein the secondary switch comprises a synchronous rectifier for the power converter.

3. The controller of claim 2, wherein the secondary switch further comprises an anti-parallel diode and a transistor, wherein the enable circuit is coupled to disable the control circuit from generation of the secondary drive signal to turn ON the transistor of the secondary switch in response to the determination that the winding signal is less than the threshold at least the N number of times.

4. The controller of claim 1, further comprising:
a request circuit coupled to generate a request signal comprising a request event in response to a feedback signal representative of an output of the power converter, wherein a power switch coupled to an input winding of the power converter is coupled to be turned ON in response to the request event.

5. The controller of claim 4, wherein the winding signal detection circuit is coupled to determine if the winding signal is less than the threshold at least the N number of times after the request event, and the enable circuit is coupled to disable the control circuit from generation of the secondary drive signal to turn ON the secondary switch after a next request event in response to the determination of the winding signal is less than the threshold at least the N number of times after the request event.

6. The controller of claim 4, wherein the winding signal detection circuit is coupled to receive the request signal and generate a disable signal representative of a determination that the winding signal is less than the threshold at least the N number of times, the winding signal detection circuit further comprising:
a first comparator coupled to receive the threshold and the winding signal;
a counter coupled to receive the output of the first comparator and the DCM signal, wherein the counter increments a count in response to the first comparator and the DCM signal, and the counter resets the count in response to the request event; and
a second comparator coupled to compare the output of the counter to the N number of times, wherein the winding signal detection circuit is coupled to assert the disable signal in response to a determination that the count is substantially equal or greater than N.

7. The controller of claim 6, wherein the enable circuit further comprises:
a delay circuit coupled to receive the request signal with the request event and further coupled to apply a blanking time to the request event; and
a latch coupled to output the enable signal, wherein the latch is reset to deassert the enable signal in response to the disable signal.

8. The controller of claim 4, the control circuit further comprising:
a first comparator coupled to receive the winding signal and a turn-on threshold; and
a second comparator coupled to receive the winding signal and a turn-off threshold,
wherein the control circuit is coupled to output the secondary drive signal to turn ON the secondary switch in response to the winding signal falling below the turn-on threshold after the request event if the enable signal is asserted, and the control circuit is coupled to output the secondary drive signal to turn OFF the secondary switch in response to the winding signal rising above the turn-off threshold.

9. The controller of claim 4, further comprising:
a secondary signal generator circuit coupled to determine conduction of a current by the secondary switch and to generate a secondary signal representative of the conduction of the current by the secondary switch in response to the winding signal.

10. The controller of claim 9, the secondary signal generator circuit further comprising:
a first comparator coupled to receive the winding signal and a turn-on threshold; and
a second comparator coupled to receive the winding signal and a turn-off threshold, wherein the secondary signal generator circuit is coupled to determine that the secondary switch is conducting the current in response to the winding signal and the turn-on threshold after the request event, and the control circuit is further coupled to determine that the secondary switch is not conducting in response to the winding signal and the turn-off threshold.

11. The controller of claim 9, further comprising:
a DCM sense circuit coupled to output the DCM signal in response to the winding signal and to an output voltage of the power converter after the secondary switch has stopped conduction of the current.

12. The controller of claim 11, the DCM sense circuit further comprising:
a comparator coupled to receive the winding signal and the output voltage;
a first latch coupled to receive the secondary signal and the request signal; and
a second latch coupled to be set if the comparator indicates the winding signal is greater than the output voltage and the secondary signal indicates the secondary switch has stopped conduction of the current after the request event, wherein the second latch is coupled to be reset in response to a next request event in the request signal, and wherein the output of the second latch is the DCM signal.

13. A control system for use in a power converter, the control system comprising:
a primary controller coupled to an input-side of the power converter, the primary controller coupled to receive a request signal comprising a request event, wherein the primary controller is coupled to turn ON a primary switch coupled to the input-side of the power converter to control the transfer of energy between the input-side and an output-side of the power converter; and
a secondary controller coupled to the output-side of the power converter, the secondary controller comprising:
a request circuit coupled to generate the request signal comprising the request event in response to a feedback signal representative of an output of the power converter;
a control circuit coupled to generate a secondary drive signal to control a turn ON and a turn OFF of a secondary switch coupled to the output-side of the power converter; and
an enable circuit coupled to receive a winding signal representative of a voltage of an output winding of the power converter and to generate an enable signal in response to a number of times the winding signal falls below a threshold after the request event and a determination that the secondary switch has stopped conduction of a current, wherein the enable circuit outputs the enable signal to enable or disable the control circuit from output of the secondary drive signal to turn ON the secondary switch.

14. The control system of claim 13, wherein the secondary switch further comprises an anti-parallel diode and a transistor and the enable circuit outputs the enable signal to enable or disable the control circuit from output of the secondary drive signal to turn ON the transistor of the secondary switch.

15. The control system of claim 13, wherein the control circuit is coupled to receive the winding signal, the enable signal, and the request signal comprising the request event, the control circuit further coupled to output the secondary drive signal to turn ON the secondary switch in response to the winding signal falling below a turn-on threshold after the request event if the enable signal is asserted, and to output the secondary drive signal to turn OFF the secondary switch in response to the winding signal rising above a turn-off threshold.

16. The control system of claim 13, the enable circuit further comprising:
a winding signal detection circuit coupled to receive the winding signal and to determine the number of times the winding signal is below the threshold after the request event and no conduction of the current by the secondary switch,
wherein the enable circuit outputs the enable signal to prevent the control system from control of the turn ON of the secondary switch in response to the number of times the winding signal is below the threshold is substantially equal to a value N.

17. The control system of claim 13, the secondary controller further comprising:
a secondary signal generator circuit coupled to receive the winding signal and to detect conduction of the current by the secondary switch in response to the winding signal.

18. The control system of claim 17, wherein the secondary signal generator circuit is coupled to determine conduction of the current by the secondary switch in response to the winding signal falling below a turn-on threshold after the request event and coupled to determine no conduction of the current by the secondary switch in response to the winding signal rising above a turn-off threshold.

19. The control system of claim 13, the secondary controller further comprising:
a discontinuous conduction mode (DCM) sense circuit coupled to receive the winding signal and an output voltage of the power converter and coupled to determine a discontinuous conduction mode (DCM) operation of the power converter in response to the winding signal rising above a DCM threshold after the secondary switch has stopped conduction of the current.

* * * * *